US012211559B2

(12) United States Patent
Cho et al.

(10) Patent No.: US 12,211,559 B2
(45) Date of Patent: Jan. 28, 2025

(54) PAGE BUFFER CIRCUIT AND MEMORY DEVICE INCLUDING THE SAME

(71) Applicant: Samsung Electronics Co., Ltd., Suwon-si (KR)

(72) Inventors: Yongsung Cho, Suwon-si (KR); Min-Hwi Kim, Suwon-si (KR); Makoto Hirano, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 188 days.

(21) Appl. No.: 17/965,004

(22) Filed: Oct. 13, 2022

(65) Prior Publication Data

US 2023/0143829 A1 May 11, 2023

(30) Foreign Application Priority Data

Nov. 10, 2021 (KR) .................. 10-2021-0154254
May 31, 2022 (KR) .................. 10-2022-0066917

(51) Int. Cl.
*G11C 16/24* (2006.01)
*G06F 12/0802* (2016.01)
*G11C 16/04* (2006.01)
*H10B 43/27* (2023.01)

(52) U.S. Cl.
CPC .......... *G11C 16/24* (2013.01); *G06F 12/0802* (2013.01); *G11C 16/0483* (2013.01); *H10B 43/27* (2023.02)

(58) Field of Classification Search
CPC . G11C 16/0483; G11C 7/1057; G11C 7/1051; G11C 7/1078; G11C 2211/5642; G11C 2211/5643; G06F 12/0246; G06F 12/0802
See application file for complete search history.

(56) References Cited

U.S. PATENT DOCUMENTS

| 9,543,026 | B2 | 1/2017 | Song et al. |
| 10,497,448 | B2 | 12/2019 | Arakawa |
| 10,664,395 | B2 | 5/2020 | Oh et al. |
| 10,720,207 | B2 | 7/2020 | Cho et al. |
| 10,796,769 | B2 | 10/2020 | Kim et al. |
| 10,984,873 | B2 | 4/2021 | Park et al. |
| 2017/0092369 | A1* | 3/2017 | Song ............... G11C 16/26 |

(Continued)

OTHER PUBLICATIONS

Extended European Search Report dated Apr. 13, 2023 for corresponding EP Patent Application No. 22203682.4.

*Primary Examiner* — Uyen Smet
(74) *Attorney, Agent, or Firm* — Muir Patent Law, PLLC

(57) ABSTRACT

A memory device includes a memory cell array and a page buffer circuit, wherein the page buffer circuit includes page buffer units including upper page buffer units and lower page buffer units and cache units arranged between the upper page buffer unit and the lower page buffer units. The cache units include upper cache units and lower cache units. Each page buffer unit includes a sensing node and a pass transistor. The upper cache units share a first combined sensing node, and, the lower cache units share a second combined sensing node. In a data transmission period, sensing nodes respectively included the page buffer units are electrically connected to one another through serial connections of the pass transistors respectively included in the page buffer units.

20 Claims, 26 Drawing Sheets

(56) References Cited

U.S. PATENT DOCUMENTS

2017/0123724 A1* 5/2017 Park ................... G11C 16/0483
2017/0278580 A1* 9/2017 Lim .................... G06F 11/2094
2020/0019508 A1* 1/2020 Oh ...................... G06F 12/0215
2021/0074367 A1* 3/2021 Oh ..................... G11C 16/0483

* cited by examiner

PAGE BUFFER CIRCUIT AND MEMORY DEVICE INCLUDING THE SAME

CROSS-REFERENCE TO RELATED APPLICATIONS

This application is based on and claims priority under 35 U.S.C. § 119 to Korean Patent Application Nos. 10-2021-0154254, filed on Nov. 10, 2021, and 10-2022-0066917, filed on May 31, 2022, in the Korean Intellectual Property Office, the disclosures of which are incorporated by reference herein in their entireties.

BACKGROUND

The inventive concept relates to a memory device, and more particularly, to a page buffer circuit and a memory device including the page buffer circuit.

Recently, along with the multifunctionalization of information and communication devices, memory devices with larger capacity and higher integration are demanded. A memory device may include a page buffer for storing data in or outputting data from memory cells, and the page buffer may include semiconductor devices like transistors. Sizes of semiconductor devices included in a page buffer may be reduced according to a demand for reducing the size of a page buffer according to an increase in the degree of integration of a memory device and a development of process technology, and thus, the layout of wires connected to semiconductor devices may become complicated.

SUMMARY

Aspects of the inventive concept provides a page buffer circuit and a memory device including the page buffer circuit, wherein the sensing reliability of the memory device is increased by reducing the size of a page buffer.

According to an aspect of the inventive concept, a memory device includes a memory cell array including a plurality of memory cells connected to bit lines, and a page buffer circuit connected to the bit lines, wherein the page buffer circuit includes page buffer units comprising a first set of page buffer units arranged in a first direction and a second set of page buffer units arranged in the first direction; and cache units arranged, in the first direction, between the first set of page buffer units and the second set of page buffer units, the cache units comprising first cache units respectively corresponding to the first set of page buffer units and second cache units respectively corresponding to the second set of page buffer units. Each of the page buffer units comprises a sensing node and a pass transistor connected to the sensing node and configured to be selectively turned on during a data transmission period, the first cache units share a first combined sensing node, and the first combined sensing node is connected to a pass transistor included in an first page buffer unit adjacent to the first cache units from among the first set of page buffer units, the second cache units share a second combined sensing node, and the second combined sensing node is connected to a pass transistor included in a second page buffer unit adjacent to the second cache units from among the second set of page buffer units, and, the sensing nodes respectively corresponding to the page buffer units are configured to, during the data transmission period, be electrically connected to one another through serial connections of pass transistors respectively included in the page buffer units.

According to another aspect of the inventive concept, a memory device includes a memory cell array including a plurality of memory cells connected to bit lines, and a page buffer circuit connected to the bit lines and arranged in first to fourth regions arranged in a first direction, wherein the page buffer circuit include upper page buffer units arranged in the first region in the first direction and each including an upper pass transistor and an upper sensing node line, lower page buffer units arranged in the fourth region in the first direction and each including a lower pass transistor and a lower sensing node line, upper cache units arranged in the second region in the first direction and commonly connected to a first combined sensing node, and lower cache units arranged in the third region in the first direction and commonly connected to a second combined sensing node. The memory device is configured such that, in a data transmission period, upper sensing node lines respectively included in the upper page buffer units are connected to the first combined sensing node as upper pass transistors respectively included in the upper page buffer units are turned on and lower sensing node lines respectively included in the lower page buffer units are connected to the second combined sensing node as lower pass transistors respectively included in the lower page buffer units are turned on. The upper sensing node lines and the lower sensing node lines are arranged along a line in the first direction.

According to another aspect of the inventive concept, there memory device includes a memory cell array including a plurality of memory cells connected to bit lines, a page buffer circuit comprising first page buffer units, second page buffer units, and cache units, which are arranged between the first page buffer units and the second page buffer units and comprise first cache units and second cache units. The memory device is configured such that, in a data transmission period, first data transmission operations between the first page buffer units and the first cache units are performed simultaneously with second data transmission operations between the second page buffer units and the second cache units, in a first period of a pass/fail determination period after the data transmission period, first pass/fail determination operations regarding the first page buffer units are sequentially performed, and, in a second period of the pass/fail determination period, second pass/fail determination operations regarding the second page buffer units are sequentially performed.

According to another aspect of the inventive concept, a page buffer circuit includes upper page buffer units arranged in a first region in a first direction and each including an upper pass transistor and an upper sensing node line, upper cache units arranged in a second region in the first direction and commonly connected to a first combined sensing node, lower cache units arranged in a third region in the first direction and commonly connected to a second combined sensing node, and lower page buffer units arranged in a fourth region in the first direction and each including a lower pass transistor and a lower sensing node line. The page buffer circuit is configured such that, in a data sensing period, upper pass transistors respectively included in the upper page buffer units and lower pass transistors respectively included in the lower page buffer units are turned off, in a data transmission period after the data sensing period, upper sensing node lines respectively included in the upper page buffer units are connected to the first combined sensing node as the upper pass transistors are turned on and lower sensing node lines respectively included in the lower page buffer units are connected to the second combined sensing node as the lower pass transistors are turned on. The first to fourth regions are arranged in the first direction, and the upper sensing node lines and the lower sensing node lines are arranged along a line in the first direction.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
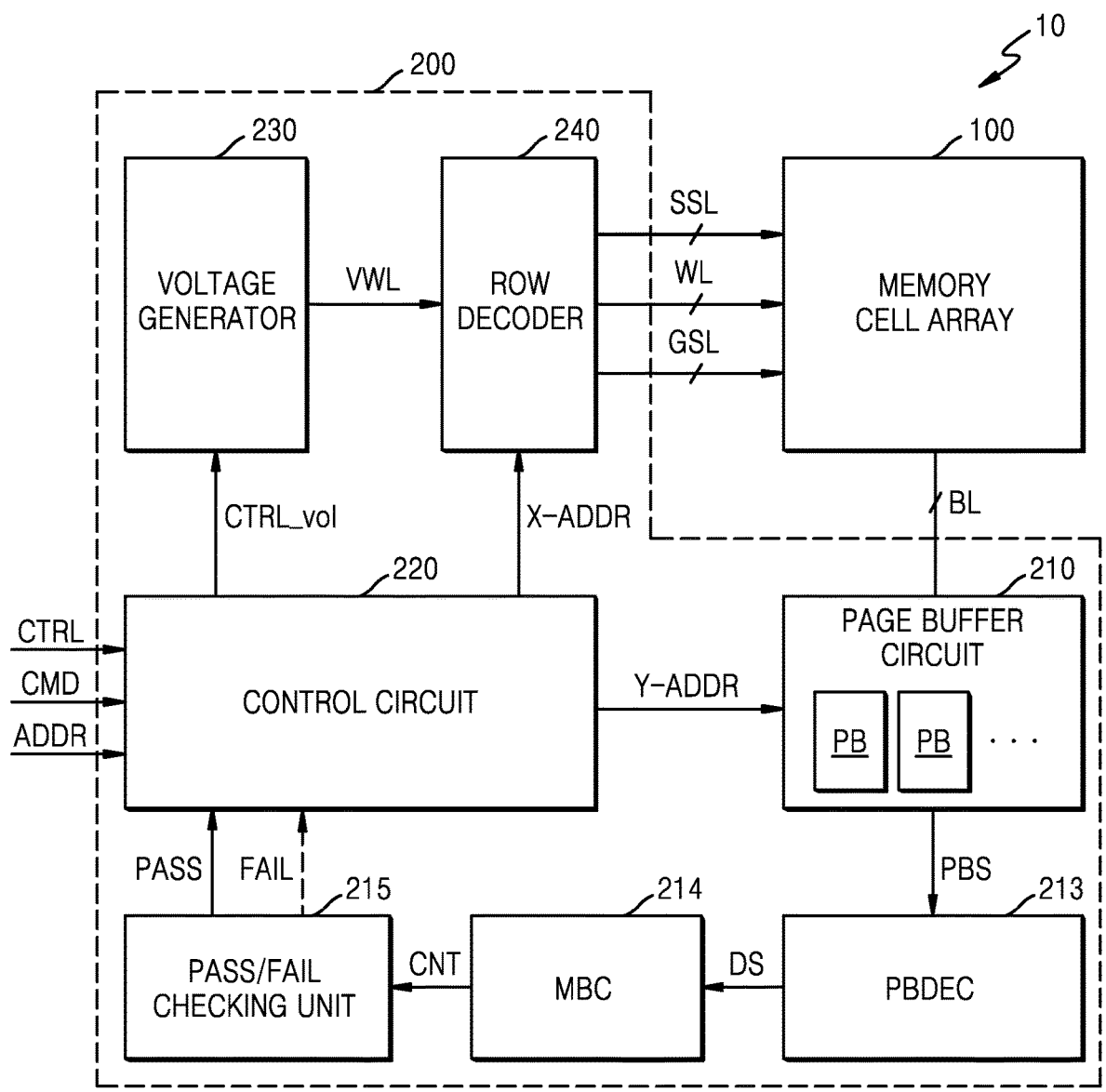
FIG. 1 is a block diagram showing a memory device according to an embodiment.

FIG. 1 is a block diagram showing the memory device 10 according to an embodiment. Referring to FIG. 1, the memory device 10 may include a memory cell array 100 and a peripheral circuit 200, and the peripheral circuit 200 may include a page buffer circuit 210, a control circuit 220, a voltage generator 230, a row decoder 240, a page buffer decoder (PBDEC) 213, a mass bit counter (MBC) 214, and a pass/fail checking unit 215.

The memory cell array 100 may be connected to the page buffer circuit 210 through bit lines BL and may be connected to the row decoder 240 through word lines WL, string select lines SSL, and ground select lines GSL. The memory cell array 100 may include a plurality of memory cells. For example, the memory cells may be flash memory cells. Hereinafter, embodiments of the inventive concept will be described in detail based on an example case where the memory cells are nonvolatile memory cells such as NAND flash memory cells. However, the inventive concept is not limited thereto, and the memory cells may be resistive memory cells like resistive RAM (ReRAM) cells, phase change RAM (PRAM) cells, or magnetic RAM (MRAM) cells.

In an embodiment, the memory cell array 100 may include a 3-dimensional memory cell array. The 3-dimensional memory cell array may include a plurality of NAND strings, and each NAND string may include memory cells respectively connected to word lines vertically stacked on a substrate. Detailed descriptions thereof will be given later with reference to FIGS. 3, 4A, and 4B. U.S. Pat. Nos. 7,679,133, 8,553,466, 8,654,587, 8,559,235, and U.S. Patent Application No. 2011/0233648 disclose detailed suitable configurations for a 3-dimensional memory array including multiple levels and in which word lines and/or bit lines are shared between the levels, and are incorporated herein by reference in their entirety.

The control circuit 220 may output various control signals, e.g., a voltage control signal CTRL_vol, a row address X_ADDR, and a column address Y_ADDR, for programming data to the memory cell array 100, reading data from the memory cell array 100, or erasing data stored in the memory cell array 100, based on a command CMD, an address ADDR, and a control signal CTRL. Therefore, the control circuit 220 may overall control various operations within the memory device 10.

The voltage generator 230 may generate various types of voltages for performing a program operation, a read operation, and an erase operation on the memory cell array 100 based on the voltage control signal CTRL_Vol. In detail, the voltage generator 230 may generate a word line voltage VWL, e.g., a program voltage, a read voltage, a pass voltage, an erase verify voltage, or a program verify voltage. The row decoder 240 may select one of a plurality of memory blocks in response to the row address X_ADDR, may select one of the word lines WL of a selected memory block, and may select one of the string select lines SSL. The page buffer circuit 230 may select at least some bit lines from among the bit lines BL in response to the column address Y_ADDR. In detail, the page buffer circuit 210 operates as a write driver or a sense amplifier depending on an operation mode.

The page buffer circuit 210 may include a plurality of page buffers PB respectively connected to a plurality of bit lines BL. Page buffer units (e.g., PBU0 to PBUn of FIG. 5) respectively included in the page buffers PB and cache latches (e.g., CL0 to CLn of FIG. 5) respectively included in the page buffers PB may be spaced apart from each other and have separate structures. Therefore, the degree of freedom for the wires arranged above the page buffer units may be improved and the complexity of the layout may be reduced. Also, since the cache latches are arranged adjacent to data input/output lines, a distance between the cache latches and the data input/output lines may be reduced, thereby improving a data input/output speed. Also, the page buffer units may be divided into two groups each including upper page buffer units, upper page buffer units and lower page buffer units, or lower page buffer units, and cache latches may be arranged between the upper page buffer units and the lower page buffer units.

According to an embodiment, each page buffer unit may include a pair of pass transistors (e.g., TR0 and TR0' of FIG. 11) and a sensing node line (e.g., MT0a of FIG. 11) for electrically connecting the pair of pass transistors to each other. Here, the sensing node line may be implemented as one track of a lower metal layer (e.g., LM0 of FIG. 11) and may correspond to a sensing node. A "track" as described herein, refers to a straight segment of material extending lengthwise in only one horizontal direction. An item, layer, or portion of an item or layer described as extending "lengthwise" in a particular direction has a length in the particular direction and a width perpendicular to that direction, where the length is greater than the width. During a data sensing period, pass transistors respectively included in the page buffer units may not be electrically connected to each other, and thus sensing node lines respectively included in the page buffer units may not be electrically connected to each other. Meanwhile, during a data transmission period, the pass transistors respectively included in the page buffer units may be connected to each other in series, and thus the sensing node lines respectively included in the page buffer units may be electrically connected to each other and used as data transmission lines. Therefore, since the page buffer circuit 210 does not need to separately provide a plurality of data transmission lines for respectively connecting the page buffer units and the cache latches, the area occupied by the page buffer circuit 210 may be reduced.

The PBDEC 213 may generate a decoder output signal DS corresponding to the number of fail bits from a page buffer signal PBS received from the page buffer circuit 210. For example, when the page buffer signal PBS is logic low, it may be determined that programming to a corresponding memory cell has failed, and data of the corresponding memory cell may be determined as a fail bit. In detail, the PBDEC 213 may receive a reference current from a current generator (not shown) and generate the decoder output signal DS based on the received reference current.

The MBC 214 may receive the decoder output signal DS from the PBDEC 213 and generate a count result CNT from the decoder output signal DS. For example, the MBC 214 may be an analog-to-digital converter that converts the decoder output signal DS that is an analog signal into a count result CNT that is a digital signal. In detail, the MBC 214 may receive a reference current from the current generator (not shown) and generate the count result CNT based on the received reference current.

The pass/fail checking unit 215, which may be a circuit, may receive the count result CNT from the MBC 214, generate a pass signal PASS or a fail signal FAIL based on the count result CNT, and provide the pass signal PASS or the fail signal FAIL to the control circuit 220. For example, when the count result CNT is less than or equal to a reference number, the pass/fail checking unit 215 may generate the pass signal PASS. When the count result CNT is greater than the reference number, the pass/fail checking unit 215 may generate the fail signal FAIL.

Figure 2:
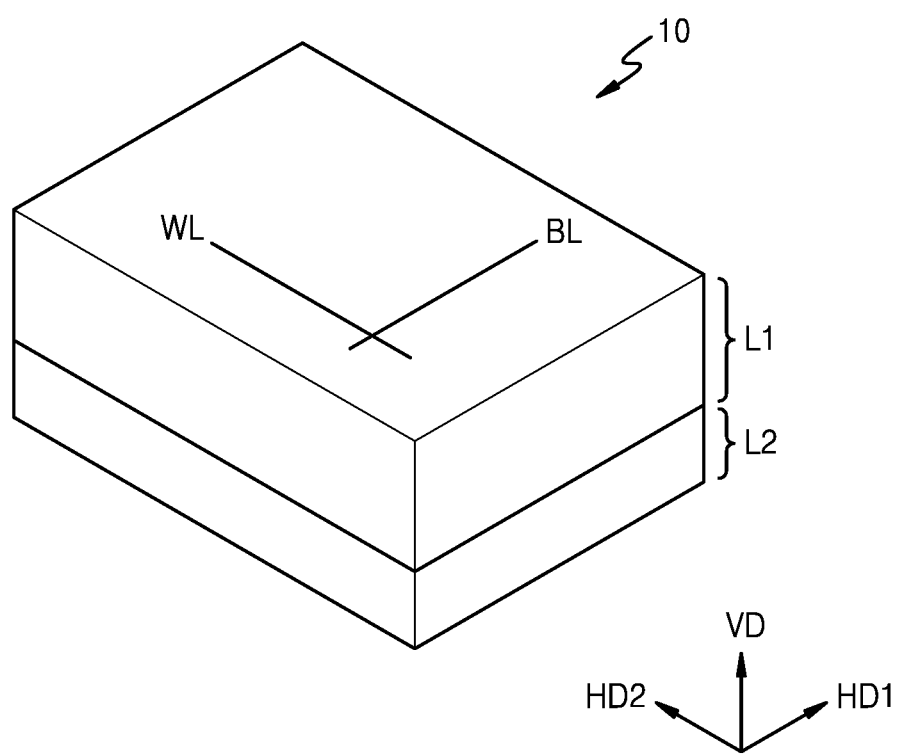
FIG. 2 is a diagram schematically showing the structure of the memory device of FIG. 1, according to an embodiment.

FIG. 2 is a diagram schematically showing the structure of the memory device 10 of FIG. 1, according to an embodiment. Referring to FIG. 2, the memory device 10 may include a first semiconductor layer L1 and a second semiconductor layer L2, and the first semiconductor layer L1 may be stacked in a vertical direction VD with respect to the second semiconductor layer L2. In detail, the second semiconductor layer L2 may be disposed below the first semiconductor layer L1 in the vertical direction VD. According to an embodiment, the memory cell array 100 of FIG. 1 may be formed in the first semiconductor layer L1, and the peripheral circuit 200 of FIG. 1 may be formed in the second semiconductor layer L2. Therefore, the memory device 10 may have a structure in which the memory cell array 100 is disposed above the peripheral circuit 200, that is, a cell-over-periphery (COP) structure. The COP structure may reduce a horizontal area and improve the degree of integration of the memory device 10.

In an embodiment, the second semiconductor layer L2 may include a substrate, and the peripheral circuit 200 may be formed in the second semiconductor layer L2 by forming transistors and metal patterns (e.g., first and third lower metal layers LM0 and LM2 of FIG. 11) for wiring the transistors on the substrate. After the peripheral circuit 200 is formed on the second semiconductor layer L2, the first semiconductor layer L1 including the memory cell array 100 may be formed, and metal patterns for electrically connecting the word lines WL and the bit lines BL of the memory cell array 100 to the peripheral circuit 200 formed in the second semiconductor layer L2 may be formed. For example, the bit lines BL may extend in a first horizontal direction or a first direction HD1, and the word lines WL may extend in a second horizontal direction or a second direction HD2.

As the number of stacks of memory cells arranged in the memory cell array 100 increases (i.e., as the number of stacks of the word lines WL increases) with the development of semiconductor processing technology, the area of the memory cell array 100 is reduced, and thus the area of the peripheral circuit 200 is also reduced. According to the present embodiment, the page buffer circuit 210 has a structure in which page buffer units and cache latches are separated from each other, and, by connecting sensing nodes included in the respective page buffer units in common to a combined sensing node, the area occupied by the page buffer circuit 210 may be reduced. Detailed descriptions thereof will be given later with reference to FIG. 11.

Figure 3:
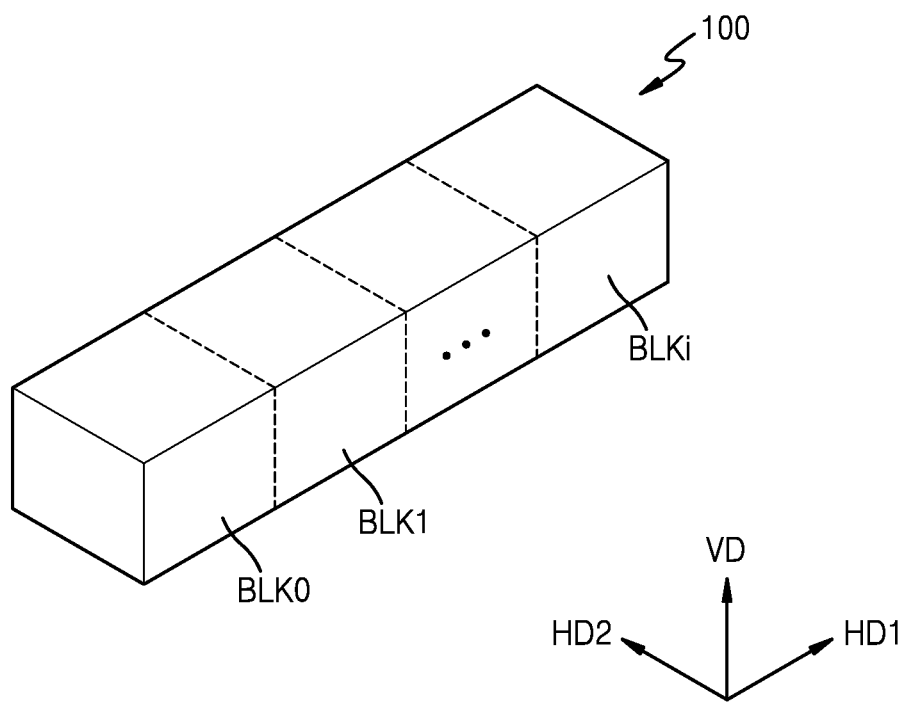
FIG. 3 is a diagram showing an example of a memory cell array of FIG. 1, according to an embodiment.

FIG. 3 is a diagram showing an example of the memory cell array 100 of FIG. 1, according to an embodiment. Referring to FIG. 3, the memory cell array 100 may include a plurality of memory blocks BLK0 to BLKi, and i may be a positive integer. The memory blocks BLK1 to BLKi may each have a 3-dimensional structure (or a vertical structure). The memory blocks BLK0 to BLKi may each include a plurality of NAND strings extending in the vertical direction VD. Here, the NAND strings may be provided to be a particular distance spaced apart from one another in the first direction HD1 and the second direction HD2.

Figure 4A:
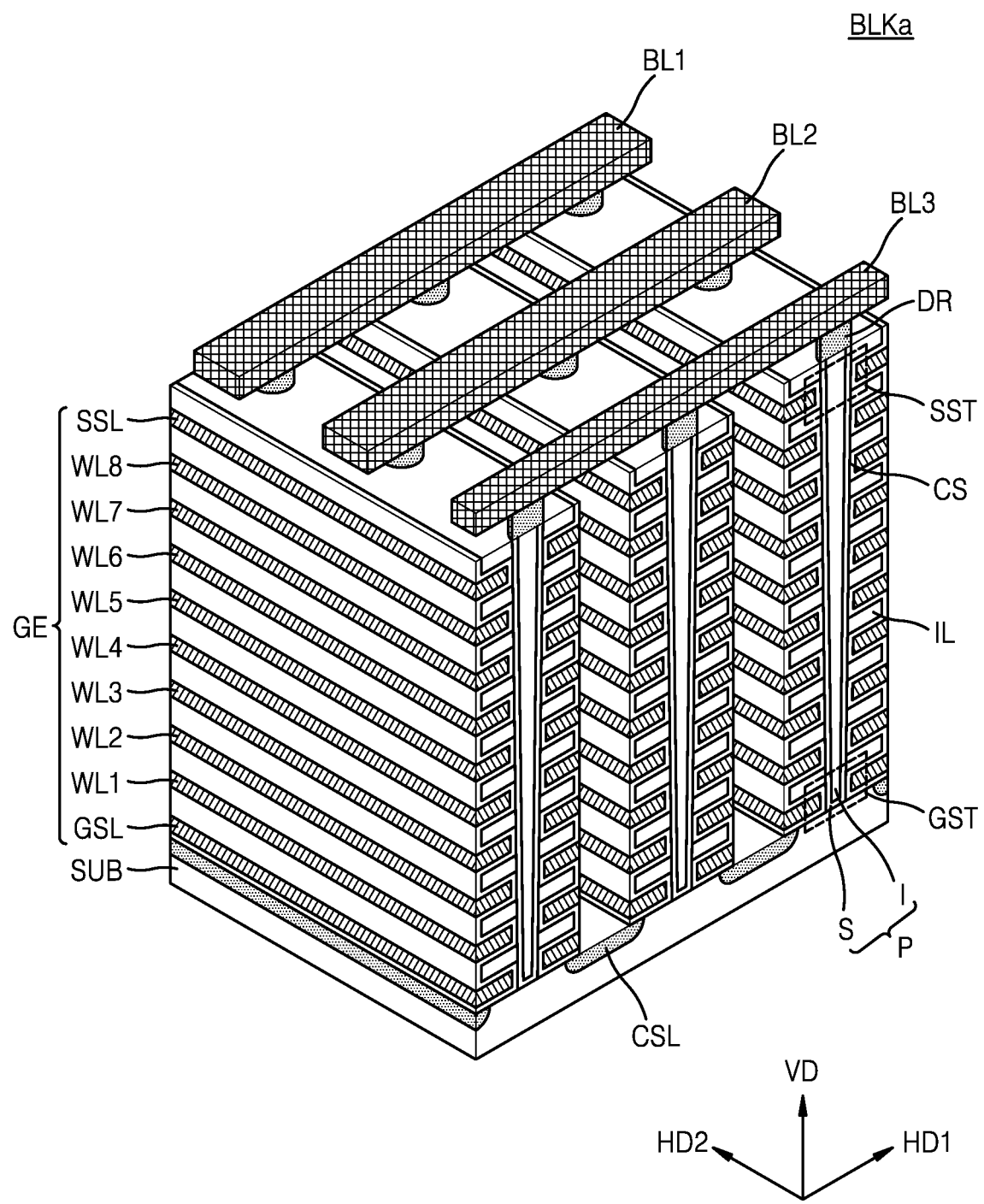
FIGS. 4A and 4B are perspective views of a memory block of FIG. 3, according to some embodiments.

FIG. 4A is a perspective view of a memory block BLKa according to an embodiment. Referring to FIG. 4A, the memory block BLKa may correspond to one of the memory blocks BLK1 to BLKi of FIG. 3. The memory block BLKa is formed in the vertical direction VD with respect to a substrate SUB having a first conductivity type (e.g., p-type). According to an embodiment, the common source line CSL doped with impurities of a second conductivity type (e.g., n-type) may be provided on the substrate SUB. According to an embodiment, the substrate SUB may be implemented by using polysilicon, and a plate-type common source line CSL may be disposed on the substrate SUB. On the substrate SUB, a plurality of insulation layers IL extending in the second direction HD2 are sequentially provided in the vertical direction VD, and the insulation layers IL are spaced apart from one another by a certain distance in the vertical direction VD. For example, the insulation layers IL may include or may be formed of an insulating material like silicon oxide.

A plurality of pillars P connected to each bit line, which pillars are sequentially arranged in the first direction HD1 and penetrate through the insulation layers IL in the vertical direction VD, are provided on the substrate SUB. For example, the pillars P will contact the substrate SUB by penetrating through the insulation layers IL. In detail, a surface layer S of each pillar P may include or be formed of a silicon-based material doped with impurities of the first conductivity type and function as a channel region. Therefore, the pillars P may be referred to as a vertical channel structure. An internal layer I of each pillar P may include an insulating material like silicon oxide or an air gap.

A charge storage layer CS is provided along exposed surfaces of the insulation layers IL, the pillars P, and the substrate SUB. The charge storage layer CS may include a gate insulation layer, a charge trapping layer, and a blocking insulation layer. For example, the charge storage layer CS may have an oxide-nitride-oxide (ONO) structure. Also, on an exposed surface of the charge storage layer CS, gate electrodes GE such as a ground select line GSL, a string select line SSL, and word lines WL1 to WL8 are provided. Drains DR are provided on the pillars P, respectively. For example, the drains DR may include or be formed of a silicon-based material doped with impurities of the second conductivity type. Bit lines BL1 to BL3 extending in a first direction HD1 and being a certain distance apart from one another in the second direction HD2 may be provided on the drains DR.

Figure 4B:
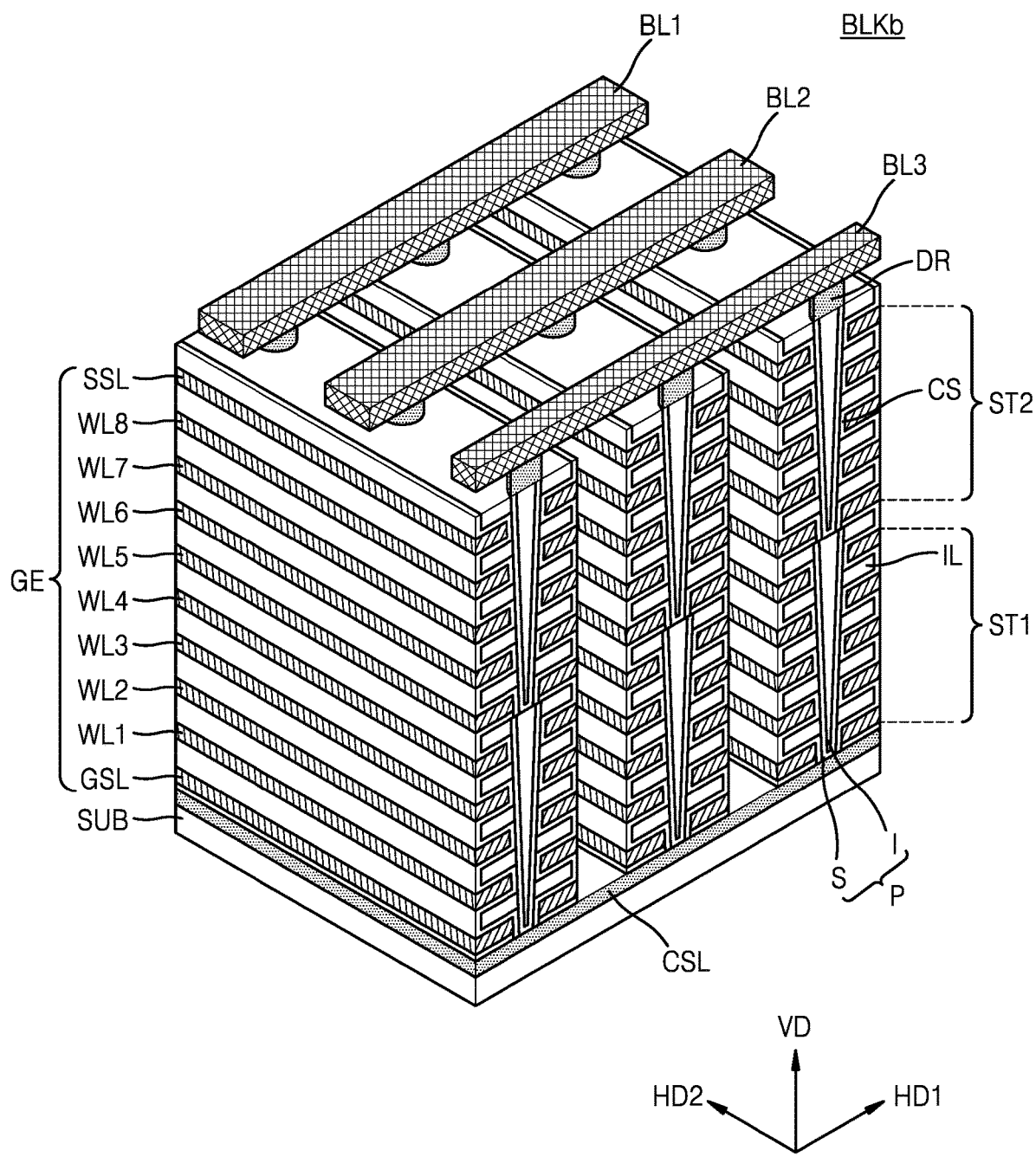

FIG. 4B is a perspective view of a memory block BLKb according to an embodiment. Referring to FIG. 4B, the memory block BLKb may correspond to one of the memory blocks BLK1 to BLKi of FIG. 3. Also, the memory block BLKb corresponds to a modified example of the memory block BLKa of FIG. 4A, and the descriptions given above with reference to FIG. 4A may also be applied to the present embodiment. The memory block BLKb may include a first memory stack ST1 and a second memory stack ST2 stacked in the vertical direction VD. However, the inventive concept is not limited thereto, and the memory block BLKb may include three or more memory stacks.

Figure 5:
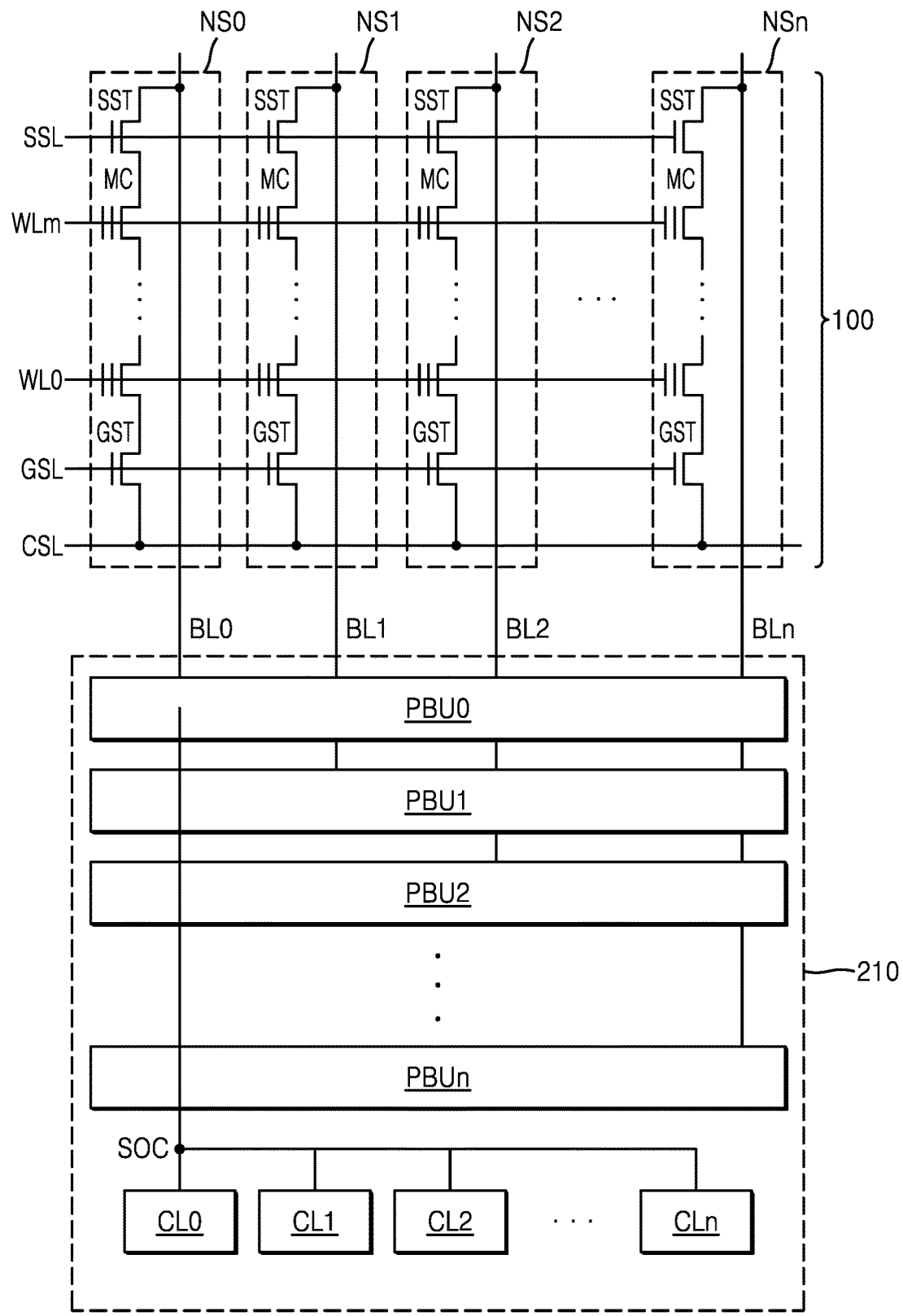
FIG. 5 is a diagram showing an example of a connection between a memory cell array and a page buffer circuit according to an embodiment.

FIG. 5 is a diagram showing an example of the connection between the memory cell array 100 and the page buffer circuit 210 according to an embodiment.

Referring to FIG. 5, the memory cell array 100 may include first to n+1-th NAND strings NS0 to NSn, the first to n+1-th NAND strings NS0 to NSn may each include a ground select transistor GST connected to a ground select line GSL, a plurality of memory cells MC respectively connected to a plurality of word lines WL0 to WLm, and a string select transistor SST connected to a string select line SSL, and the ground select transistor GST, the memory cells MC, and the string select transistor SST may be connected to one another in series and may be arranged in a vertical direction. Here, m is a positive integer.

The page buffer circuit 210 may include first to n+1-th page buffer units PBU0 to PBUn. A first page buffer unit PBU0 is connected to a first NAND string NS0 through a first bit line BL0, and an n+1-th page buffer unit PBUn may be connected to an n+1-th NAND string NSn through an n+1th bit line BLn. Here, n is a positive integer. For example, n may be 7, and the first to n+1-th page buffer units PBU0 to PBUn of the page buffer circuit 210 may be divided into an upper page buffer group and a lower page buffer group, wherein page buffer units included in the upper page buffer group may be arranged along a line, and page buffer units included in the lower page buffer group may be arranged along a line. Each page buffer unit may be described as a page buffer segment, since it is part of the page buffer circuit as a whole. Each page buffer unit may include a circuit that outputs a data bit corresponding to data being written to or read from a memory cell.

The page buffer circuit 210 may further include first to n+1-th cache latches CL0 to CLn respectively corresponding to the first to n+1-th page buffer units PBU0 to PBUn. For example, n may be 7, and the page buffer circuit 210 may have a structure in which eight cache latches CL0 to CLn are arranged along a line. For example, the first to n+1-th cache latches CL0 to CLn may be arranged along a line in a direction in which first to n+1-th bit lines BL0 to BLn extend between the upper page buffer group and the lower page buffer group.

Sensing nodes of the first to n+1-th page buffer units PBU0 to PBUn may be commonly connected to a combined sensing node SOC, and the first to n+1-th cache latches CL0 to CLn may also be commonly connected to the SOC. Therefore, the first to n+1-th page buffer units PBU0 to PBUn may be connected to the first to n+1-th cache latches CL0 to CLn through the combined sensing node SOC.

Figure 6:
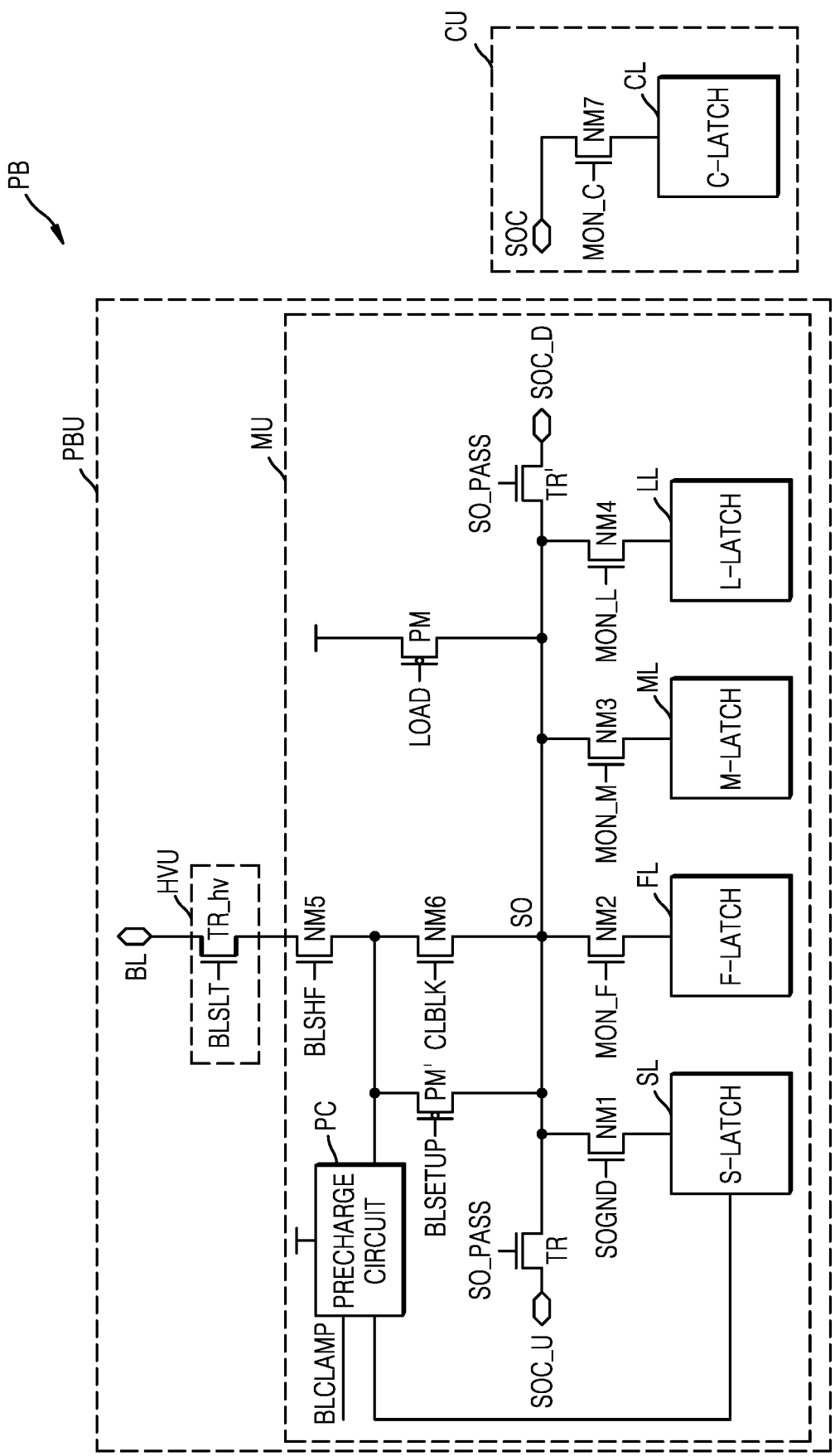
FIG. 6 is a diagram showing a page buffer of FIG. 1 in detail, according to an embodiment.

FIG. 6 is a diagram showing a page buffer PB according to an embodiment.

Referring to FIG. 6, the page buffer PB may correspond to an example of the page buffer PB of FIG. 1. The page buffer PB may include a page buffer unit PBU and a cache unit CU. Since the cache unit CU includes a cache latch CL (C-LATCH), and the cache latch CL is connected to a data input/output line, the cache unit CU may be disposed adjacent to the data input/output line. Therefore, the page buffer unit PBU and the cache unit CU may be disposed to be spaced apart from each other, and thus the page buffer PB may have a structure in which the page buffer unit PBU and the cache unit CU are separated from each other.

The page buffer unit PBU may include a main unit MU, and the main unit MU may include major transistors in the page buffer PB. The page buffer unit PBU may further include a bit line select transistor TR_hv connected to a bit line BL and driven by a bit line select signal BLSLT. The bit line selection transistor TR_hv may be implemented as a high-voltage transistor and may be disposed in a well region different from the main unit MU, that is, in a high-voltage unit HVU.

The main unit MU may include a sensing latch SL (S-LATCH), a force latch FL (F-LATCH), an upper bit latch or most-significant-bit latch ML (M-LATCH), and a lower bit latch or a least-significant-bit latch LL (L-LATCH). According to some embodiments, the sensing latch SL, the force latch FL, the more-significant-bit latch ML, or the less-significant-bit latch LL may be referred to as a "main latch". The main unit MU may further include a pre-charge circuit PC capable of controlling a pre-charge operation for the bit line BL or a sensing node SO based on a bit line clamping control signal BLCLAMP and may further include a transistor PM' driven by a bit line setup signal BLSETUP.

The sensing latch SL may store data stored in a memory cell or a result of sensing a threshold voltage of a memory cell during a read operation or a program verification operation. Also, the sensing latch SL may be used to apply a program bit line voltage or a program inhibit voltage to the bit line BL during a program operation. The force latch FL may be used to store force data and improve threshold voltage distribution during a program operation. The force data may be initially set to '1' and then inverted to '0' when the threshold voltage of a memory cell enters a forcing region that is less than a target region. The more-significant-bit latch ML, the less-significant-bit latch LL, and the cache latch CL may be used to store data input from the outside during a program operation. The cache latch CL may receive data read from a memory cell during a read operation from the sensing latch SL and output the data to the outside through a data input/output line.

The main unit MU may further include first to fourth transistors NM1 to NM4. A first transistor NM1 may be connected between the sensing node SO and the sensing latch SL and may be driven by a ground control signal SOGND. A second transistor NM2 may be connected between the sensing node SO and the force latch FL and may be driven by a forcing monitoring signal MON_F. A third transistor NM3 may be connected between the sensing node SO and the more-significant-bit latch ML and may be driven by a more-significant-bit monitoring signal MON_M. A fourth transistor NM4 may be connected between the sensing node SO and the less-significant-bit latch LL and may be driven by a less-significant-bit monitoring signal MON_L.

The main unit MU may further include a fifth transistor NM5 and a sixth transistor NM6 connected in series between the bit line select transistor TR_hv and the sensing node SO. A fifth transistor NM5 may be driven by a bit line shut-off signal BLSHF, and a sixth transistor NM6 may be driven by a bit line connection control signal CLBLK. Also, the main unit MU may further include a pre-charge transistor PM. The pre-charge transistor PM is connected to the sensing node SO, is driven by a load signal LOAD, and pre-charges the sensing node SO to a pre-charge level during a pre-charge period.

The main unit MU may further include a pair of pass transistors connected to the sensing node SO, that is, a first pass transistor TR and a second pass transistor TR'. According to some embodiments, the first pass transistor TR and the second pass transistors TR' may be referred to as "a first sensing node connecting transistor and a second sensing node connecting transistor", respectively. The first pass transistor TR and the second pass transistors TR' may be driven according to a pass control signal SO_PASS. According to some embodiments, the pass control signal SO_PASS may be referred to as a "sensing node connection control signal". A first pass transistor TR may be connected between a first terminal SOC_U and the sensing node SO, and a second pass transistor TR' may be connected between the sensing node SO and a second terminal SOC_D.

For example, when the page buffer unit PBU is a second page buffer unit PBU1 of FIG. 5, the first terminal SOC_U may be connected to one end of a pass transistor included in the first page buffer unit PBU0, and the second terminal SOC_D may be connected to one end of a pass transistor included in a third page buffer unit PBU2. Therefore, the sensing node SO may be electrically connected to the combined sensing node SOC through pass transistors respectively included in third to n+1-th page buffer units PBU2 to PBUn.

Figure 7:
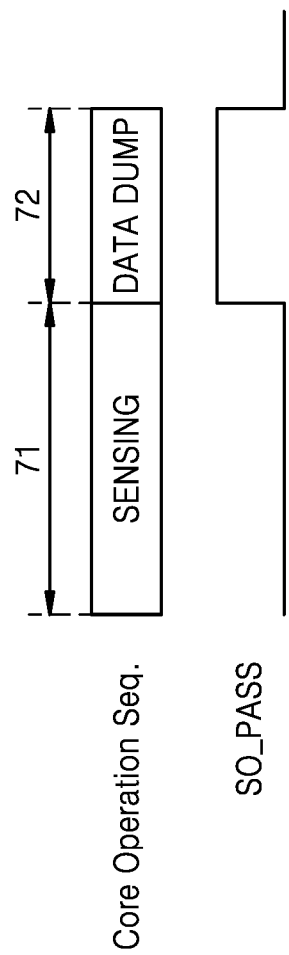
FIGS. 7 and 8 are timing diagrams showing examples of voltage levels of a pass control signal according to a core operation sequence, according to an embodiment.

FIG. 7 is a timing diagram showing an example of voltage levels of a pass control signal according to a core operation sequence, according to an embodiment. Referring to FIGS. 6 and 7 together, the core operation sequence represents the operation of the page buffer PB. For example, the core operation sequence may include a data sensing period 71 in which a data sensing operation is performed and a data dumping period or a data transmission period 72 in which a data dumping operation or a data transmission operation is performed.

In the data sensing period 71, the pass control signal SO_PASS may be deactivated, and the first pass transistor TR and the second pass transistors TR' may be turned off. Therefore, the page buffer unit PBU may not be electrically connected to the combined sensing node SOC, and the page buffer unit PBU may not be electrically connected to the cache unit CU. Also, the page buffer unit PBU may not be electrically connected to an adjacent page buffer unit PBU. For example, the data sensing period 71 may include a pre-charge period for pre-charging the voltage of the bit line BL or the sensing node SO to a pre-charge level, a develop period for electrically connecting the bit line BL to the sensing node SO to develop the voltage of the sensing node SO, and a sensing period for sensing the voltage of the sensing node SO.

In the data transmission period 72, the pass control signal SO_PASS may be activated, and the first pass transistor TR and the second pass transistors TR' may be turned on. Therefore, the page buffer unit PBU may be electrically connected to the combined sensing node SOC, and the page buffer unit PBU may be electrically connected to the cache unit CU. Also, the page buffer unit PBU may be electrically connected to an adjacent page buffer unit PBU. For example, the data transmission period 72 may include a period in which an operation of dumping read data stored in the sensing latch SL to the cache latch CL is performed, a period in which an operation of dumping program data stored in the cache latch CL to the sensing latch SL is performed, or a period in which data stored in the cache latch CL is transmitted to a data input/output circuit.

Figure 8:
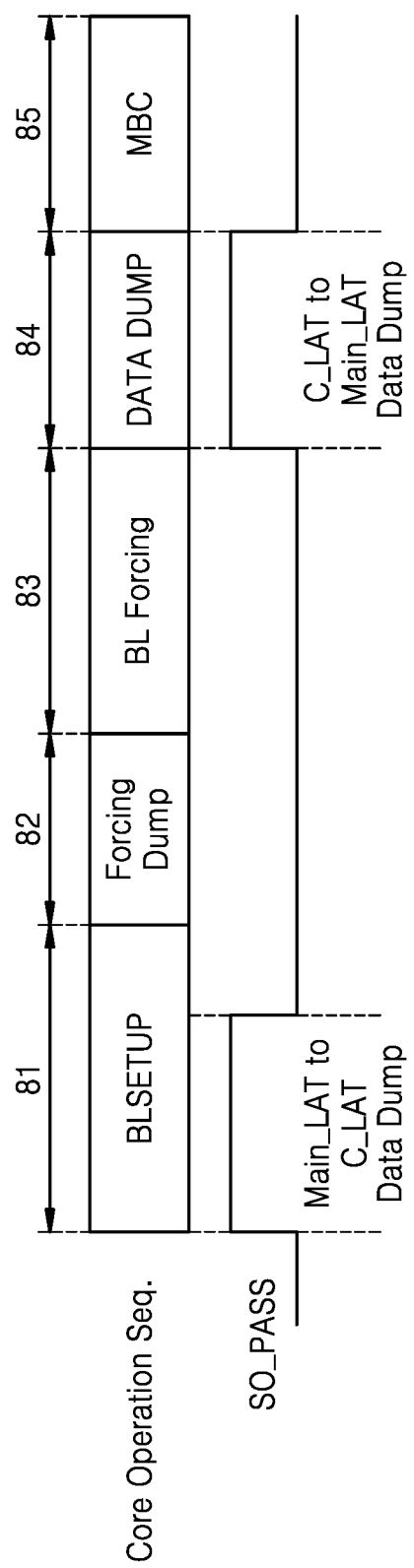

FIG. 8 is a timing diagram showing another example of voltage levels of a pass control signal according to a core operation sequence, according to an embodiment. Referring to FIGS. 6 and 8 together, the core operation sequence represents the operation of the page buffer PB. For example, the core operation sequence may include a bit line setup period 81, a forcing dumping period 82, a bit line forcing period 83, a data dumping period or a data transmission period 84, and an MBC period 85.

In the bit line setup period 81, the pass control signal SO_PASS may be activated, and the first pass transistor TR and the second pass transistors TR' may be turned on. At this time, as the sensing node SO and the combined sensing node SOC are electrically connected, data may be dumped from the main latch (e.g., the sensing latch SL, the force latch FL, the more-significant-bit latch ML, or the less-significant-bit latch LL) included in the page buffer unit PBU to the cache latch CL.

In the forcing dumping period 82 and the bit line forcing period 83, the pass control signal SO_PASS may be deactivated, and the first pass transistor TR and the second pass transistors TR' may be turned off. Therefore, the page buffer unit PBU may not be electrically connected to the cache unit CU and may not be electrically connected to an adjacent page buffer unit PBU. In the forcing dumping period 82, a dumping operation may be performed to select a bit line to be forced to a bias lower than a power voltage level when a program operation is performed. For example, data may be dumped from the force latch FL to the sensing latch SL. In the bit line forcing period 83, a voltage applied to the bit line BL may be changed according to a value stored in the force latch FL during a program operation.

In the data transmission period 84, the pass control signal SO_PASS may be activated, and the first pass transistor TR and the second pass transistors TR' may be turned on. For example, in the data transmission period 84, a dumping operation of marking data stored in the sensing latch SL connected to memory cells, which failed as a result of a program verification, from among memory cells, which are to be programmed to a target program state when a program operation is performed, as logic low may be performed. Here, as the sensing node SO and the combined sensing node SOC are electrically connected, data may be dumped from the cache latch CL to the main latch (e.g., the sensing latch SL).

In the MBC period 85, the pass control signal SO_PASS may be deactivated, and the first pass transistor TR and the second pass transistors TR' may be turned off. Therefore, the page buffer unit PBU may not be electrically connected to the cache unit CU and may not be electrically connected to an adjacent page buffer unit PBU. In the MBC period 85, the number of sensing latches marked as logic low in the previous data transmission period 84 may be counted.

Figure 9:
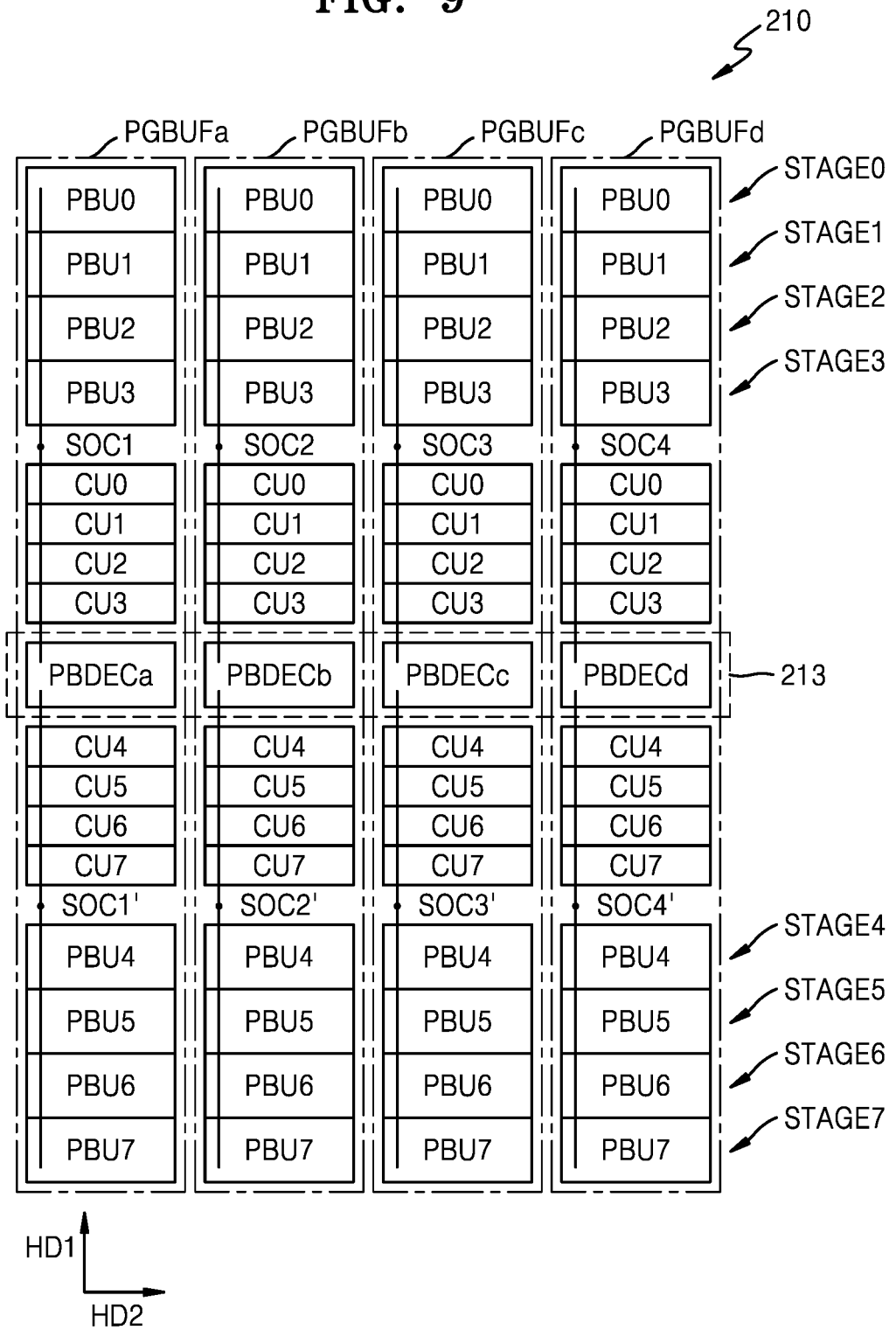
FIG. 9 is a diagram showing a page buffer circuit and a page buffer decoder according to an embodiment.

FIG. 9 is a diagram showing the page buffer circuit 210 and the PBDEC 213 according to an embodiment. Referring to FIG. 9, the page buffer circuit 210 may have a structure having multiple stages in the first direction HD1, e.g., 8-stages STAGE0 to STAGE7. The page buffer circuit 210 includes first to fourth page buffer circuits PGBUFa to PGBUFd arranged along the second direction HD2, and the first to fourth page buffer circuits PGBUFa to PGBUFd may be referred to as "first to fourth page buffer columns". The first to fourth page buffer circuits PGBUFa to PGBUFd may each include first to eighth page buffer units PBU0 to PBU7 and first to eighth cache units CU0 to CU7 arranged in the first direction HD1. Here, the number of page buffer columns included in the page buffer circuit 210 and the number of page buffer units and the number of cache units included in each page buffer column may be variously changed according to embodiments. It should be noted that the first direction HD1 and second direction HD2 refer to horizontal directions, in relation to the vertical direction VD described, for example, in connection with FIGS. 2, 3, 4A, and 4B.

Since the size of the first to eighth page buffer units PBU0 to PBU7 in the second direction HD2 decreases as the width of a transistor decreases, more page buffer units can be included in the same row in the page buffer circuit 210 (e.g., a row extends in the HD2 direction). Therefore, the page buffer circuit 210 may be implemented as a page buffer array including the first to fourth page buffer circuits PGBUFa to PGBUFd. Hereinafter, the configuration of a first page buffer circuit PGBUFa will be described. Descriptions of the first page buffer circuit PGBUFa may also be applied to second to fourth page buffer circuits PGBUFb to PGBUFd.

The first to eighth page buffer units PBU0 to PBU7 may be separated into two groups. First to fourth page buffer units PBU0 to PBU3 corresponding to first to fourth stages STAGE0 to STAGE3 may be referred to as upper page buffer units PBU0 to PBU3, or a first set of page buffer units, and fifth to eighth page buffer units PBU4 to PBU7 corresponding to fifth to eighth stages STAGE4 to STAGE7 may be referred to as lower page buffer units PBU4 to PBU7, or a second set of page buffer units. Each set of page buffer units may include a plurality of page buffer units directly and consecutively adjacent to each other in a particular direction (e.g., the HD1 direction).

The first to eighth cache units CU0 to CU7 may be arranged between the upper page buffer units, e.g., the first to fourth page buffer units PBU0 to PBU3, and the lower page buffer units, e.g., the fifth to eighth page buffer units PBU4 to PBU7. For example, along the direction that the page buffer units are consecutively arranged (e.g., the HD1 direction), the first to eighth cache units CU0 to CU7 may be arranged also along the same direction, and all of the first to eighth cache units CU0 to CU7 may be positioned between a first set of page buffer units and a second set of page buffer units. Here, the first to eighth cache units CU0 to CU7 may be separated into two groups, or sets. First to fourth cache units CU0 to CU3 may be arranged adjacent to the first to fourth page buffer units PBU0 to PBU3 in correspondence to the first to fourth page buffer units PBU0 to PBU3, respectively, and may be referred to as upper cache units CU0 to CU3, or a first set of cache units. Meanwhile, fifth to eighth cache units CU4 to CU7 may be arranged adjacent to the fifth to eighth page buffer units PBU4 to PBU7 in correspondence to the fifth to eighth page buffer units PBU4 to PBU7, respectively, and may be referred to as or lower cache units CU4 to CU7, or a second set of cache units. Ordinal numbers such as "first," "second," "third," etc. may be used simply as labels of certain elements, steps, etc., to distinguish such elements, steps, etc. from one another. Terms that are not described using "first," "second," etc., in the specification, may still be referred to as "first" or "second" in a claim. In addition, a term that is referenced with a particular ordinal number (e.g., "first" in a particular claim) may be described elsewhere with a different ordinal number (e.g., "second" in the specification or another claim). Also, the terms "upper" and "lower" in the context of page buffer units and cache units and their related components as discussed in connection with FIGS. 5-12 for example, may be used as a naming convention to refer to a set of units that are all at a particular location in relation to a second set of units.

In the first page buffer circuit PGBUFa, sensing nodes of the first to fourth page buffer units PBU0 to PBU3 may be commonly connected to a first combined sensing node SOC1, the first to fourth cache units CU0 to CU3 may be commonly connected to the first combined sensing node SOC1, sensing nodes of the fifth to eighth page buffer units PBU4 to PBU7 may be commonly connected to a second combined sensing node SOC1', and the fifth to eighth cache units CU4 to CU7 may be commonly connected to the second combined sensing node SOC1'. Similarly, a second page buffer circuit PGBUFb may include a first combined sensing node SOC2 and a second combined sensing node SOC2', a third page buffer circuit PGBUFc may include a first combined sensing node SOC3 and a second combined sensing node SOC3', and a fourth page buffer circuit PGBUFd may include a first combined sensing node SOC4 and a second combined sensing node SOC4'.

The PBDEC 213 may be disposed between the first to fourth cache units CU0 to CU3 and the fifth to eighth cache units CU4 to CU7. The PBDEC 213 may include first to fourth PBDECs PBDECa to PBDECd arranged in the second direction HD2, and the first to fourth PBDECs PBDECa to PBDECd may be connected to the first to fourth page buffer circuits PGBUFa to PGBUFd, respectively. A first PBDEC PBDECa may be connected to the first to fourth page buffer units PBU0 to PBU3 and the first to fourth cache units CU0 to CU3 and may also be connected to the fifth to eighth page buffer units PBU4 to PBU7 and the fifth to eighth cache units CU4 to CU7.

Figure 10:
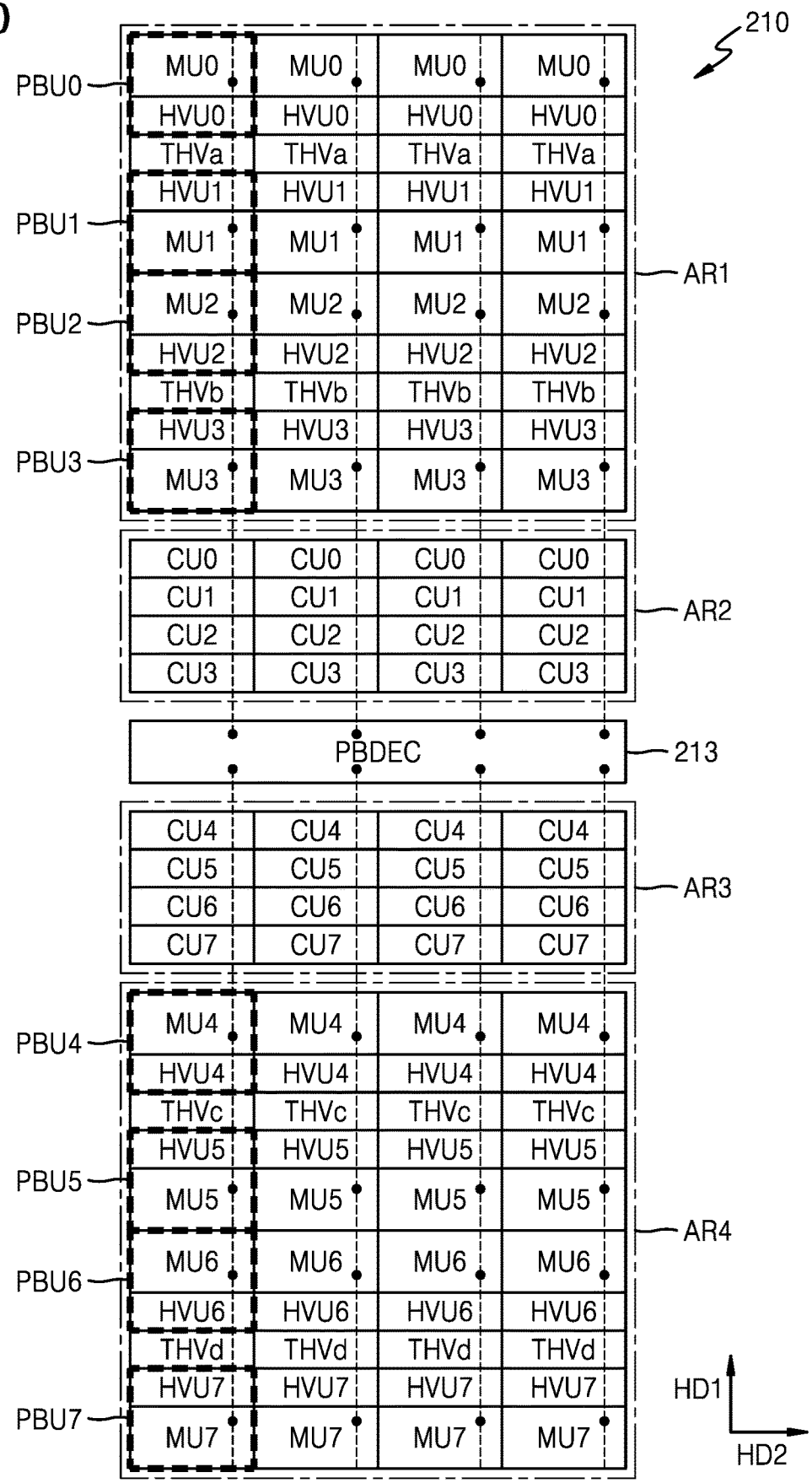
FIG. 10 is a diagram showing a page buffer circuit and a page buffer decoder according to an embodiment in more details.

FIG. 10 is a diagram showing the page buffer circuit 210 and the PBDEC 213 according to an embodiment in more detail. Referring to FIG. 10, the page buffer circuit 210 may include first to fourth areas AR1 to AR4 arranged in the first direction HD1. The first to fourth page buffer units PBU0 to PBU3 may be arranged in a first area AR1, the first to fourth cache units CU0 to CU3 may be arranged in a second area AR2, the fifth to eighth cache units CU4 to CU7 may be arranged in a third area AR3, and the fifth to eighth page buffer units PBU4 to PBU7 may be arranged in a fourth area AR4. The PBDEC 213 may be disposed between the second area AR2 and the third area AR3.

As described above with reference to FIG. 6, each page buffer unit PBU may include the main unit MU and the high-voltage unit HVU, and redundant descriptions thereof will be omitted. The first page buffer unit PBU0 may include a main unit MU0 and a high-voltage unit HVU0, the second page buffer unit PBU1 may include a main unit MU1 and a high-voltage unit HVU1, and a contact area THVa may be disposed between the first page buffer unit PBU0 and the second page buffer unit PBU1. Similarly, a fifth page buffer unit PBU4 may include a main unit MU4 and a high-voltage unit HVU4, a sixth page buffer unit PBU5 may include a main unit MU5 and a high-voltage unit HVU5, and a contact area THVc may be disposed between the fifth page buffer unit PBU4 and the sixth page buffer unit PBU5.

Main units MU0 to MU7 may each include a sensing node, and the sensing node is indicated by a dot in FIG. 10. The PBDEC 213 may be connected to sensing nodes included in main units MU0 to MU3 through an upper node and may be connected to sensing nodes included in main units MU4 to MU7 through a lower node.

Figure 11:
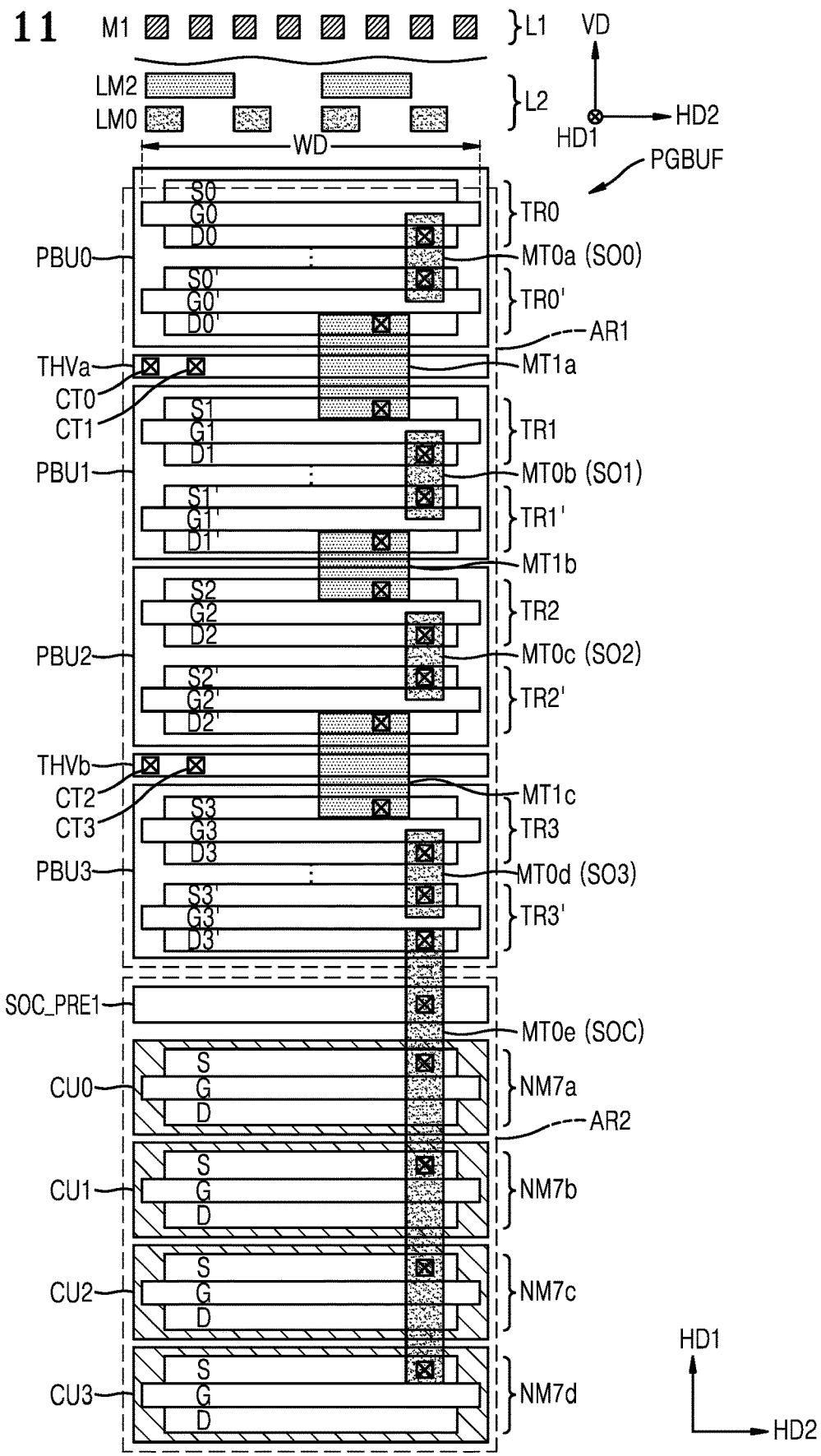
FIG. 11 is a plan view of a partial area of a page buffer circuit according to an embodiment.
Figure 12:
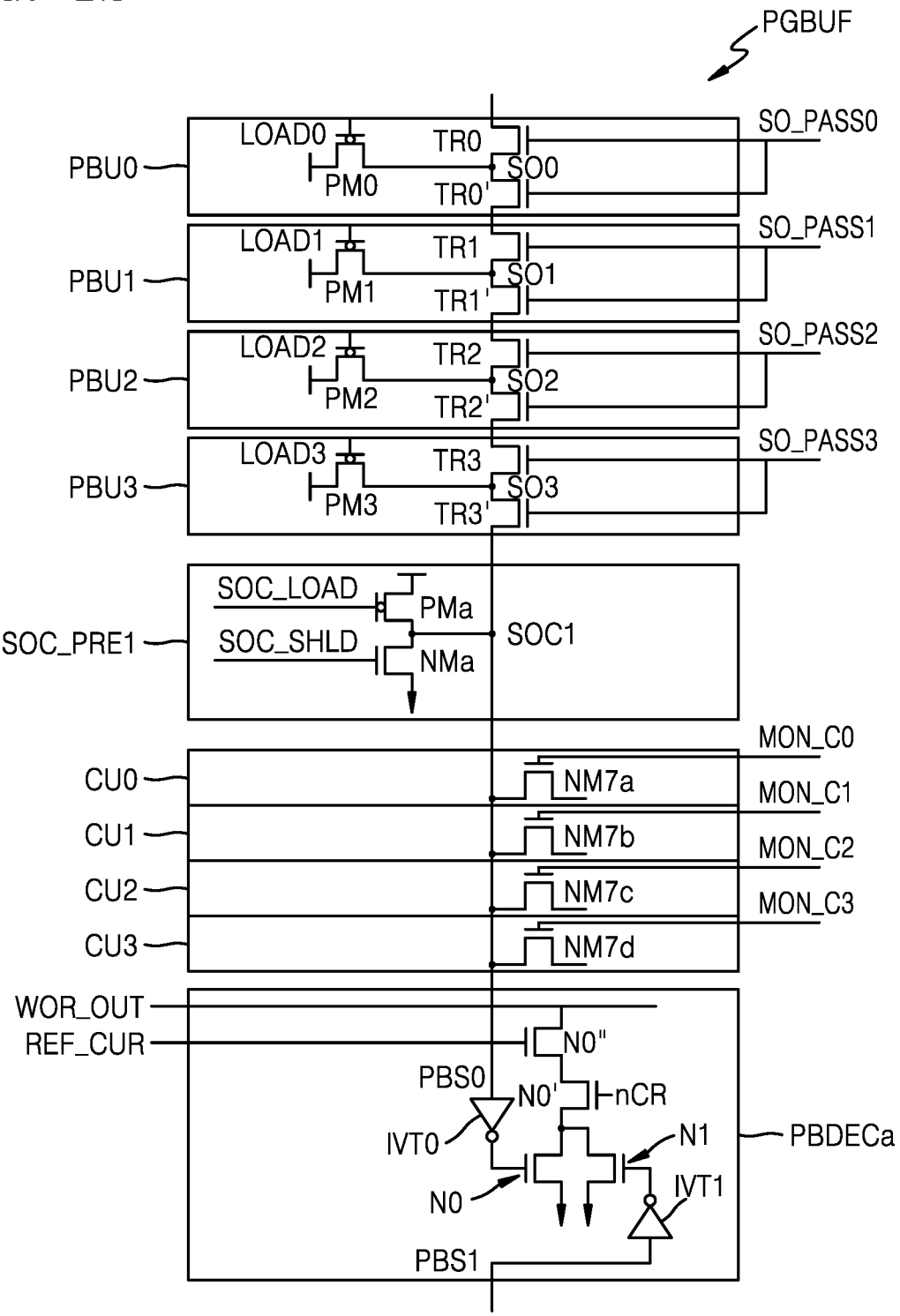
FIG. 12 is a circuit diagram showing the partial area of a page buffer circuit according to an embodiment.

FIG. 11 is a plan view of a partial area of a page buffer circuit PGBUF according to an embodiment. FIG. 12 is a circuit diagram showing the partial area of a page buffer circuit PGBUF according to an embodiment.

Referring to FIGS. 11 and 12 together, the page buffer circuit PGBUF may correspond to one of the first to fourth page buffer circuits PGBUFa to PGBUFd of FIG. 9. The page buffer circuit PGBUF may include the first to fourth page buffer units PBU0 to PBU3 arranged in the first area AR1 and the first to fourth cache units CU0 to CU3 arranged in the second area AR2. Although FIGS. 11 and 12 show only portions corresponding to the first area AR1 and the second area AR2 for convenience of illustration, the fifth to eighth cache units CU4 to CU7 and the fifth to eighth page buffer units PBU4 to PBU7 arranged in the third area AR3 and the fourth area AR4 may also be implemented similarly.

The first to fourth page buffer units PBU0 to PBU3 may each include two pass transistors, and thus the first to fourth page buffer units PBU0 to PBU3 may include total eight pass transistors TR0, TR0' to TR3, and TR3', wherein the eight pass transistors TR0, TR0' to TR3, and TR3' may be connected in series. For example, the first page buffer unit PBU0 may include a first pass transistor TR0 and a second pass transistor TR0' connected in series. For example, the first pass transistor TR0 may be disposed adjacent to a first boundary of the first page buffer unit PBU0, the second pass transistor TR0' may be disposed adjacent to a second boundary of the first page buffer unit PBU0, and the first boundary and the second boundary may be opposite each other. For example, the first pass transistor TR0 and the second pass transistor TR0' may be implemented as NMOS transistors, and thus the first pass transistor TR0 and the second pass transistor TR0' may be arranged at opposite ends of a P well of the first page buffer unit PBU0. However, the inventive concept is not limited thereto. Meanwhile, another semiconductor device, e.g., a PMOS transistor or an NMOS transistor, may be further disposed between the first boundary of the first page buffer unit PBU0 and the first pass transistor TR0. Similarly, another semiconductor device, e.g., a PMOS transistor or an NMOS transistor, may be further disposed between the second boundary of the first page buffer unit PBU0 and the second pass transistor TR0'.

For example, the first page buffer unit PBU0 may further include a plurality of transistors (e.g., transistors included in the sensing latch SL, the force latch FL, the more-significant-bit latch ML, and the less-significant-bit latch LL of FIG. 6, first to sixth transistors NM1 to NM6, etc.) arranged in the first direction HD1 between the first pass transistor TR0 and the second pass transistor TR0'. Descriptions below will focus on the configuration of the first page buffer unit PBU0, and second to fourth page buffer units PBU1 to PBU3 may have substantially the same configuration as that of the first page buffer unit PBU0.

The first pass transistor TR0 may include a source S0, a drain D0, and a gate G0, the source S0 may be connected to a first terminal (e.g., SOC_U of FIG. 6), the drain D0 may be connected to a first sensing node SO0, and a first pass control signal SO_PASS0 may be applied to the gate G0. The second pass transistor TR0' may include a source S0', a drain D0', and a gate G0', the source S0' may be connected to the first sensing node SO0, the drain D0' may be connected to a second terminal (e.g., SOC_D of FIG. 6), and the first pass control signal SO_PASS0 may be applied to the gate G0'.

Similarly, the second page buffer unit PBU1 may include a first pass transistor TR1 and a second pass transistor TR1' connected in series. The first pass transistor TR1 may include a source S1, a drain D1, and a gate G1, the second pass transistor TR1' may include a source S1', a drain D1', and a gate G1', and a second pass control signal SO_PASS1 may be applied to gates G1 and G1'. The third page buffer unit PBU2 may include a first pass transistor TR2 and a second pass transistor TR2' connected in series. The first pass transistor TR2 may include a source S2, a drain D2, and a gate G2, the second pass transistor TR2' may include a source S2', a drain D2', and a gate G2', and a third pass control signal SO_PASS2 may be applied to gates G2 and G2'. The fourth page buffer unit PBU3 may include a first pass transistor TR3 and a second pass transistor TR3' connected in series. The first pass transistor TR3 may include a source S3, a drain D3, and a gate G3, the second pass transistor TR3' may include a source S3', a drain D3', and a gate G3', and a fourth pass control signal SO_PASS3 may be applied to gates G3 and G3'. However, the inventive concept is not limited thereto, and, according to some embodiments, a combined sensing node pass control signal SOC_PASS may be applied to the gate G3'.

A first cache unit CU0 may include a monitor transistor NM7a, the monitor transistor NM7a may include a source S, a drain D, and a gate G, the source S may be connected to the first combined sensing node SOC1, and a cache monitoring signal MON_C0 may be applied to the gate G. For example, the monitor transistor NM7a may correspond to a transistor NM7 of FIG. 6. The first cache unit CU0 may further include a plurality of transistors arranged in the first direction HD1 (e.g., a plurality of transistors included in the cache latch CL of FIG. 6). Second to fourth cache units CU1 to CU3 may each have substantially the same configuration as that of the first cache unit CU0. Monitor transistors NM7a to NM7d respectively included in the first to fourth cache units CU0 to CU3 may be commonly connected in parallel to the first combined sensing node SOC1. In detail, sources of the monitor transistors NM7a to NM7d may be commonly connected to the first combined sensing node SOC1.

In the first page buffer unit PBU0, the drain D0 of the first pass transistor TR0 and the source S0' of the second pass transistor TR0' may be connected to each other through a first conductive line or a first metal pattern MT0a. Since the first metal pattern MT0a may correspond to the first sensing node SO0, the first metal pattern MT0a may be referred to as a "first sensing node line". In the second page buffer unit PBU1, the drain D1 of the first pass transistor TR1 and the source S1' of the second pass transistor TR1' may be connected to each other through a first metal pattern MT0b. Since the first metal pattern MT0b may correspond to a second sensing node SO1, the first metal pattern MT0b may be referred to as a "second sensing node line". In the third page buffer unit PBU2, the drain D2 of the first pass transistor TR2 and the source S2' of the second pass transistor TR2' may be connected to each other through a first metal pattern MT0c. Since the first metal pattern MT0c may correspond to a third sensing node SO2, the first metal pattern MT0c may be referred to as a "third sensing node line". In the fourth page buffer unit PBU3, the drain D3 of the first pass transistor TR3 and the source S3' of the second pass transistor TR3' may be connected to each other through a first metal pattern MT0d. Since the first metal pattern MT0d may correspond to a fourth sensing node SO3, the first metal pattern MT0d may be referred to as a "fourth sensing node line". Here, first to fourth sensing node lines may be arranged in a line in the first direction HD1.

The drain D3' of the second pass transistor TR3' of the fourth page buffer unit PBU3 and the source S of the monitor transistor NM7a of the first cache unit CU0 may be connected to each other through a first metal pattern MT0e. Here, the first metal pattern MT0e may also be connected to a pre-charge circuit SOC_PRE. The first metal pattern MT0e may correspond to the first combined sensing node SOC1, and thus the first metal pattern MT0e may be referred to as a "first combined sensing node line". Here, the first to fourth sensing node lines and the first combined sensing node line may be arranged in a line in the first direction HD1. According to an embodiment, first metal patterns MT0a, MT0b, MT0c, MT0d, and MT0e may be implemented as a first lower metal layer LM0 and each occupy one track (e.g., along a straight line) of the first lower metal layer LM0. Each metal pattern and metal layer may be formed, for example, by an electroplating process, or other metal deposition process.

The drain D0' of the second pass transistor TR0' of the first page buffer unit PBU0 and the source S1 of the first pass transistor TR1 of the second page buffer unit PBU1 may be connected to each other through a second conductive line or a second metal pattern MT1a, and the second metal pattern MT1a may be referred to as a "first node connecting line". The drain D1' of the second pass transistor TR1' of the second page buffer unit PBU1 and the source S2 of the first pass transistor TR2 of the third page buffer unit PBU2 may be connected to each other through a second metal pattern MT1b, and the second metal pattern MT1b may be referred to as a "second node connecting line". The drain D2' of the second pass transistor TR2' of the third page buffer unit PBU2 and the source S3 of the first pass transistor TR3 of the fourth page buffer unit PBU3 may be connected to each other through a second metal pattern MT1c, and the second metal pattern MT2c may be referred to as a "third node connecting line". For example, second metal patterns MT1a, MT1b, and MT1c may be implemented as a third lower metal layer LM2 and each occupy one track (e.g., along a straight line) of the third lower metal layer LM2. However, the inventive concept is not limited thereto, and the second metal pattern MT1a may be implemented as a second lower metal layer. Also, according to some embodiments, the second metal patterns MT1a, MT1b, and MT1c may be implemented as the first lower metal layer LM0 and may occupy one track of the first lower metal layer LM0. As discussed herein, a "track" refers to an area formed along a straight line.

According to the present embodiment, when the pass control signal SO_PASS is activated, first pass transistors TR0 to TR3 and second pass transistors TR0' to TR3' are turned on, and thus first and second pass transistors TR0 to TR3' included in the first to fourth page buffer units PBU0 to PBU3 may be connected to each other in series, and first to fourth sensing nodes SO0 to SO3 may be connected to the first combined sensing node SOC1. In detail, first and second sensing nodes SO0 and SO1 may be connected to each other through first metal patterns MT0a and MT0b and the second metal pattern MT1a, second and third sensing nodes SO1 and SO2 may be connected to each other through first metal patterns MT0b and MT0c and a second metal pattern MT1b, third and fourth sensing nodes SO2 and SO3 may be connected to each other through first metal patterns MT0c and MT0d and a second metal pattern MT1c, and the fourth sensing node SO3 and the first combined sensing node SOC1 may be connected to each other through first metal patterns MT0d and MT0e.

First metal patterns MT0a, MT0b, MT0c, and MT0d corresponding to the first to fourth sensing node lines, the second metal patterns MT1a, MT1b, and MT1c corresponding to node connecting lines, and the first metal pattern MT0e corresponding to the combined sensing node line may constitute "data transmission lines". As described above, according to the present embodiment, it is not necessary to separately provide four data transmission lines for connecting the first to fourth page buffer units PBU0 to PBU3 and the first to fourth cache units CU0 to CU3, and sensing node lines included in the first to fourth page buffer units PBU0 to PBU3 may be used as data transmission lines. Therefore, since the number of metal lines needed for wiring of the page buffer circuit PGBUF may be reduced, the complexity of a layout may be reduced and the size of the page buffer circuit PGBUF may be reduced.

The first to fourth page buffer units PBU0 to PBU3 may further include pre-charge transistors PM0 to PM3, respectively. In the first page buffer unit PBU0, a pre-charge transistor PM0 is connected between the first sensing node SO0 and a voltage terminal to which a pre-charge voltage is applied and may include a gate to which a load signal LOAD0 is applied. The pre-charge transistor PM0 may pre-charge the first sensing node SO0 to the pre-charge level corresponding to the pre-charge voltage in response to the load signal LOAD0.

The page buffer circuit PGBUF may include contact areas THVa and THVb. The contact area THVa may be disposed between the first page buffer unit PBU0 and the second page buffer unit PBU1, and a contact area THVb may be disposed between the third page buffer unit PBU2 and the fourth page buffer unit PBU3. First and second bit line contacts CT0 and CT1 respectively connected to first and second bit lines may be arranged in the contact area THVa. A first bit line contact CT0 may be connected to the first page buffer unit PBU0, and a second bit line contact CT1 may be connected to the second page buffer unit PBU1. For example, the first bit line contact CT0 may be connected to a high-voltage transistor (e.g., TR_hv of FIG. 6) included in a high-voltage unit (e.g., HVU0 of FIG. 10), and the second bit line contact CT1 may be connected to a high-voltage transistor included in a high-voltage unit (e.g., HVU1 of FIG. 10). Third and fourth bit line contacts CT2 and CT3 respectively connected to third and fourth bit lines may be arranged in the contact area THVb. A third bit line contact CT2 may be connected to the third page buffer unit PBU2, and a fourth bit line contact CT3 may be connected to the fourth page buffer unit PBU3. For example, the third bit line contact CT2 may be connected to a high-voltage transistor included in a high-voltage unit (e.g., HVU2 of FIG. 10), and the fourth bit line contact CT3 may be connected to a high-voltage transistor included in a high-voltage unit (e.g., HVU3 of FIG. 10). The bit line contacts and other conductive contacts described herein may be formed, for example, of conductive material such as metal, extending vertically between a device (e.g., transistor) to which it is connected, and a conductive pattern at a different vertical level from the device. As can be seen in FIG. 11, the second metal patterns MT1*a*, MT1*b*, MT1*c*, and MT1*d* may be at a particular level and may connect to devices at a different level through conductive contacts.

The page buffer circuit PGBUF may further include a pre-charge circuit SOC_PRE between the fourth page buffer unit PBU3 and the first cache unit CU0. The pre-charge circuit SOC_PRE may include a pre-charge transistor PMa for pre-charging the first combined sensing node SOC1 and a shielding transistor NMa. The pre-charge transistor PMa is driven by a combined sensing node load signal SOC_LOAD, and, when the pre-charge transistor PMa is turned on, the first combined sensing node SOC1 may be pre-charged to a pre-charge level. The shielding transistor NMa is driven by a combined sensing node shielding signal SOC_SHLD, and, when the shielding transistor NMa is turned on, the first combined sensing node SOC1 may be discharged to a ground level.

As a transistor width WD decreases according to the process miniaturization, the area occupied by the page buffer circuit PGBUF may decrease. For example, the transistor width WD may correspond to the size of the gate G0 of the first pass transistor TR0 in the second direction HD2. In detail, as the transistor width WD decreases, the size of the first page buffer unit PBU0 in the second direction HD2 may decrease. However, despite the decrease in the transistor width WD, the pitch of the first lower metal layer LM0 may not decrease. Therefore, the number of wires (i.e., the number of metal patterns) of the first lower metal layer LM0 disposed on the first page buffer unit PBU0 having a reduced size in the second direction HD2 is also reduced. For example, the number of metal patterns of the first lower metal layer LM0 corresponding to the first page buffer unit PBU0 may be reduced from 6 to 4.

As described above, when the number of metal patterns of the first lower metal layer LM0 corresponding to the first page buffer unit PBU0 is reduced, the sensing reliability of the first page buffer unit PBU0 may be deteriorated. For example, during a sensing operation, to prevent coupling between the first sensing node SO0 and an adjacent node, a metal pattern adjacent to the first sensing node SO0 may be used as a shielding line to which a fixed bias is applied. However, when a metal pattern corresponding to a shielding line is removed due to the reduction of metal patterns, the voltage variation at the first sensing node SO0 may increase due to the coupling between the first sensing node SO0 and an adjacent node, and thus the sensing reliability of the first page buffer unit PBU0 may be deteriorated.

However, according to the present embodiment, by arranging the first page buffer unit PBU0 and the first cache unit CU0 separately, the degree of freedom regarding first and third lower metal layers LM0 and LM2 arranged above the first page buffer unit PBU0 increases, and at least one of metal patterns included in the first and third lower metal layers LM0 and LM2 may be used as a shielding line for the first sensing node SO0. Therefore, it is possible to prevent an increase in the voltage variation at the first sensing node SO0, thereby preventing deterioration of the sensing reliability of the first page buffer unit PBU0.

Meanwhile, in a structure in which the first to fourth page buffer units PBU0 to PBU3 and the first to fourth cache units CU0 to CU3 are separated, when eight signal lines are arranged to respectively connect the first to fourth page buffer units PBU0 to PBU3 and the first to fourth cache units CU0 to CU3, the size of the page buffer circuit PGBUF in the second direction HD2 may increase again. However, according to the present embodiment, the first to fourth sensing nodes SO0 to SO3 may be connected to one another by using the first pass transistors TR0 to TR3 and the second pass transistors TR0' to TR3' included in the first to fourth page buffer units PBU0 to PBU3, and the first to fourth sensing nodes SO0 to SO3 may be connected to the first to fourth cache units CU0 to CU3 through the first combined sensing node SOC1. Here, since sensing node lines for connecting first and second pass transistors included in page buffer units to each other are implemented by using metal patterns (e.g., MT0*a*, MT0*b*, MT0*c*, and MT0*d*) of one track of the first lower metal layer LM0, the increase in the size of the page buffer circuit PGBUF in the second direction HD2 may be prevented.

A PBDEC PBDECa may include a first inverter IVT0, a second inverter IVT1, and transistors N0, N0', N0", and N1. The first inverter IVT0 may receive a first page buffer signal PBS0 from the first to fourth page buffer units PBU0 to PBU3, and an output of the first inverter IVT0 may be provided to a gate of a transistor N0. The second inverter IVT1 may receive a second page buffer signal PBS1 from the fifth to eighth page buffer units PBU4 to PBU7, and an output of the second inverter IVT1 may be provided to a gate of a transistor N1. Sources of transistors N0 and N1 may be connected to a ground terminal, and drains of the transistors N0 and N1 may be commonly connected to a transistor N0'. The transistors N0' and N0" are connected in series, a reference current signal REF_CUR is applied to a gate of the transistor N0", and a control signal nCR is applied to a gate of the transistor N0'.

For example, when a program operation with respect to a memory cell connected to the first page buffer unit PBU0 has failed, a logic low level may be stored in a sensing latch of the first page buffer unit PBU0, and, in this case, the voltage level of the first page buffer signal PBS0 may be logic low corresponding to the voltage level of the first sensing node SO0, and the voltage level of the first combined sensing node SOC1 may also be logic low. In this case, the first inverter IVT0 may output a logic high signal, and thus the transistor N0 may be turned on and the PBDEC PBDECa may operate as a current sink. The transistor N0" may output a first signal, that is, a reference current, to a wired OR terminal WOR_OUT based on the reference current signal REF_CUR. Here, the reference current may correspond to a current flowing through the transistor N0″ when the transistor N0″ is turned on according to the reference current signal REF_CUR.

For example, the PBDEC 213 may include an input/output driver, a WOR latch, and an MBC current branch. The input/output driver may control input/output signals for cache latches respectively included in the first to eighth cache units CU0 to CU7. The WOR latch may store column repair information. For example, the column repair information may be column repair information corresponding to the first page buffer circuit PGBUFa. The MBC current branch may provide a value corresponding to the number of pieces of latch data (logic high or logic low) of each page buffer unit to an MBC (e.g., 214 of FIG. 1), and thus the MBC 214 may perform digital-to-analog conversion.

Figure 13:
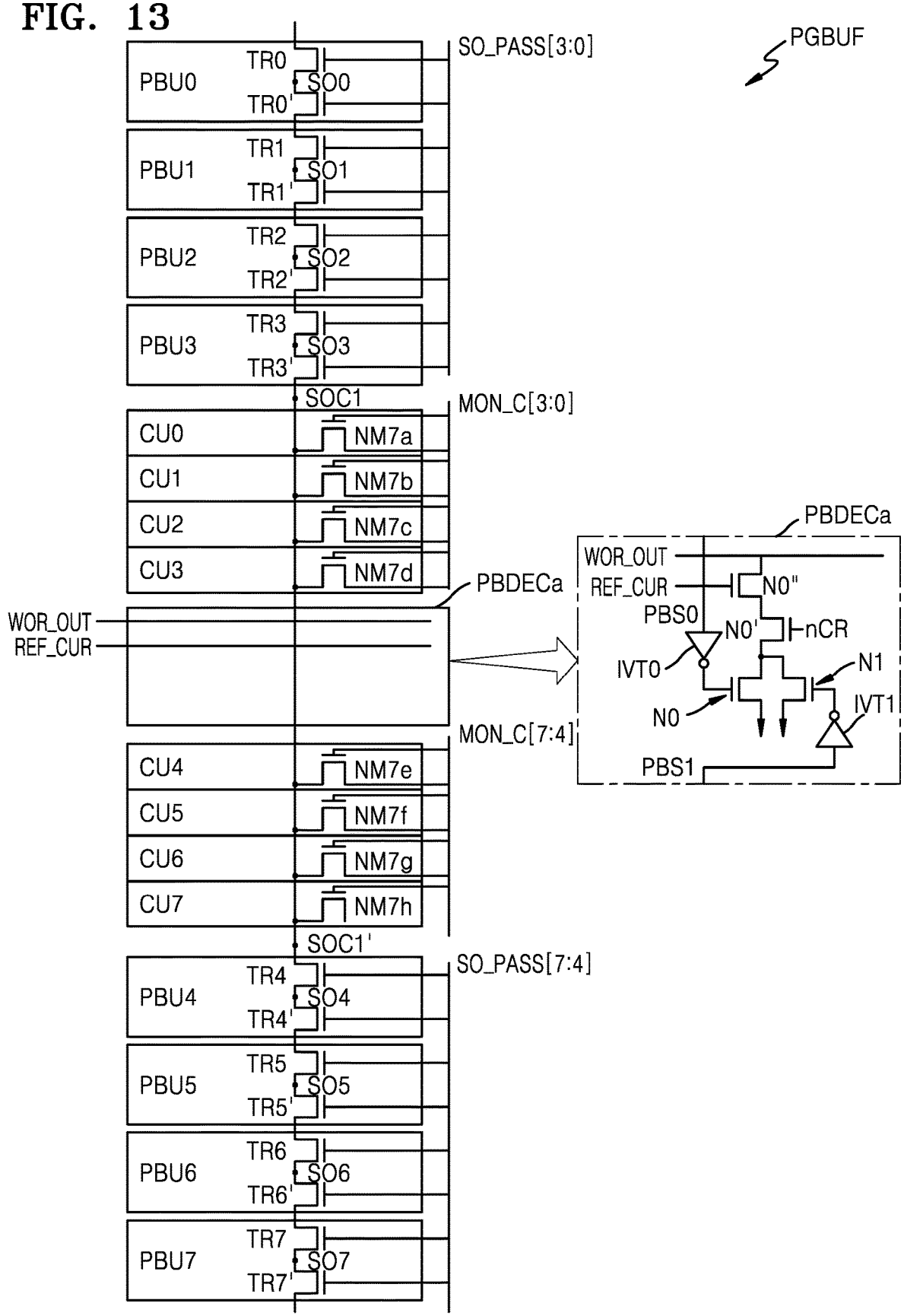
FIG. 13 is a circuit diagram showing a page buffer circuit according to an embodiment.

FIG. 13 is a circuit diagram showing the page buffer circuit PGBUF according to an embodiment. Referring to FIG. 13, the page buffer circuit PGBUF may correspond to one of the first to fourth page buffer circuits PGBUFa to PGBUFd of FIG. 9. The page buffer circuit PGBUF may include the first to eighth page buffer units PBU0 to PBU7 and the first to eighth cache units CU0 to CU7. The fifth to eighth cache units CU4 to CU7 may be disposed in the third area AR3 of FIG. 10, and the fifth to eighth page buffer units PBU4 to PBU7 may be disposed in the fourth area AR4 of FIG. 10. The descriptions of the first to fourth page buffer units PBU0 to PBU3 and the first to fourth cache units CU0 to CU3 given above with reference to FIGS. 11 and 12 may also be applied to the fifth to eighth page buffer units PBU4 to PBU7 and the fifth to eighth cache units CU4 to CU7, and thus redundant descriptions will be omitted.

The fifth page buffer unit PBU4 may include a fifth sensing node SO4 and first and second pass transistors TR4 and TR4' connected in series, the sixth page buffer unit PBU5 may include a sixth sensing node SO5 and first and second pass transistors TR5 and TR5' connected in series, a seventh page buffer unit PBU6 may include a seventh sensing node SO6 and first and second pass transistors TR6 and TR6' connected in series, an eighth page buffer unit PBU7 may include an eighth sensing node SO7 and first and second pass transistors TR7 and TR7' connected in series, and a pass control signal SO_PASS[7:4] may be applied to gates of first pass transistors TR4 to TR7 and second pass transistors TR4' to TR7'.

A fifth cache unit CU4 may include a monitor transistor NM7e, a sixth cache unit CU5 may include a monitor transistor NM7f, a seventh cache unit CU6 may include a monitor transistor NM7g, and an eighth cache unit CU7 may include a monitor transistor NM7h. Sources of monitor transistors NM7e to NM7h may be connected to the second combined sensing node SOC1', and a cache monitoring signal MON_C[7:4] may be applied to gates of the monitor transistors NM7e to NM7h.

Figure 14:
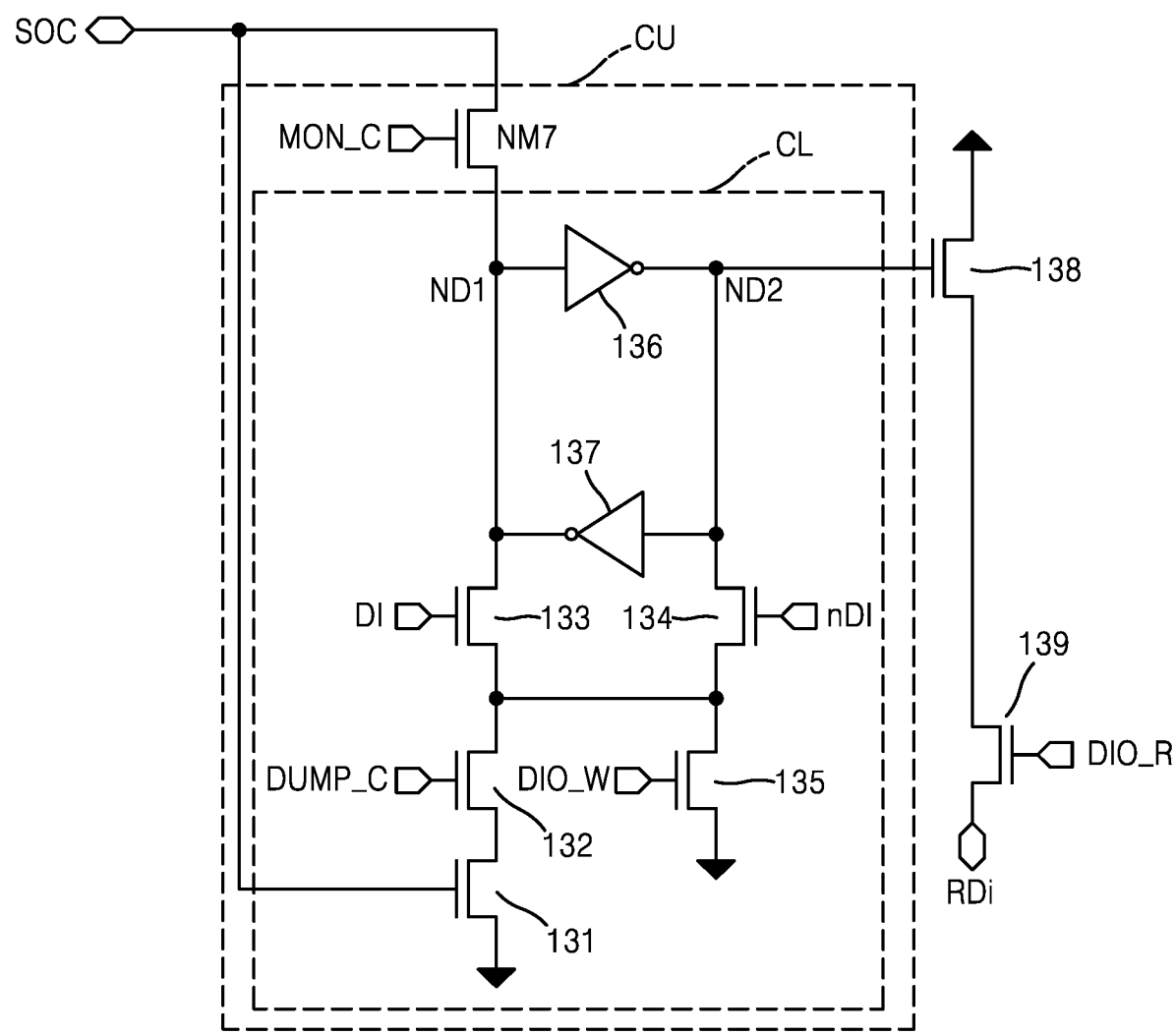
FIG. 14 is a circuit diagram showing a cache unit according to an embodiment.

FIG. 14 is a circuit diagram showing the cache unit CU according to an embodiment.

Referring to FIGS. 6 and 14 together, the cache unit CU may include a monitor transistor NM7 and the cache latch CL, and the cache latch CL may include a dump transistor 132, transistors 131 and 133 to 135, a first inverter 136, and a second inverter 137. The monitor transistor NM7 is driven according to a cache monitoring signal MON_C and may control the connection between the combined sensing node SOC and the cache latch CL. The cache unit CU may correspond to one of the first to eighth cache units CU0 to CU7 of FIG. 9.

The first inverter 136 is connected between a first node ND1 and a second node ND2, the second inverter 137 is connected between the second node ND2 and the first node ND1, and the first inverter 136 and the second inverter 137 may constitute a latch. A transistor 131 includes a gate connected to the combined sensing node SOC. The dump transistor 132 may be driven by a dump signal DUMP_C and may transmit data stored in the cache latch CL to a main latch in the page buffer unit PBU, e.g., the sensing latch SL. A transistor 133 may be driven by a data signal DI, a transistor 134 may be driven by a data inversion signal nDI, and a transistor 135 may be driven by a write control signal DIO_W. When the write control signal DIO_W is activated, voltage levels of the first node ND1 and the second node ND2 may be determined according to the data signal DI and the data inversion signal nDI, respectively.

The cache unit CU may be connected to an input/output terminal RDi through transistors 138 and 139. A transistor 138 includes a gate connected to the second node ND2 and may be turned on or turned off according to a voltage level of the second node ND2. A transistor 139 may be driven by a read control signal DIO_R. When the control signal DIO_R is activated and the transistor 139 is turned on, the voltage level of the input/output terminal RDi may be determined as '1' or '0' according to the state of the cache latch CL.

Figure 15:
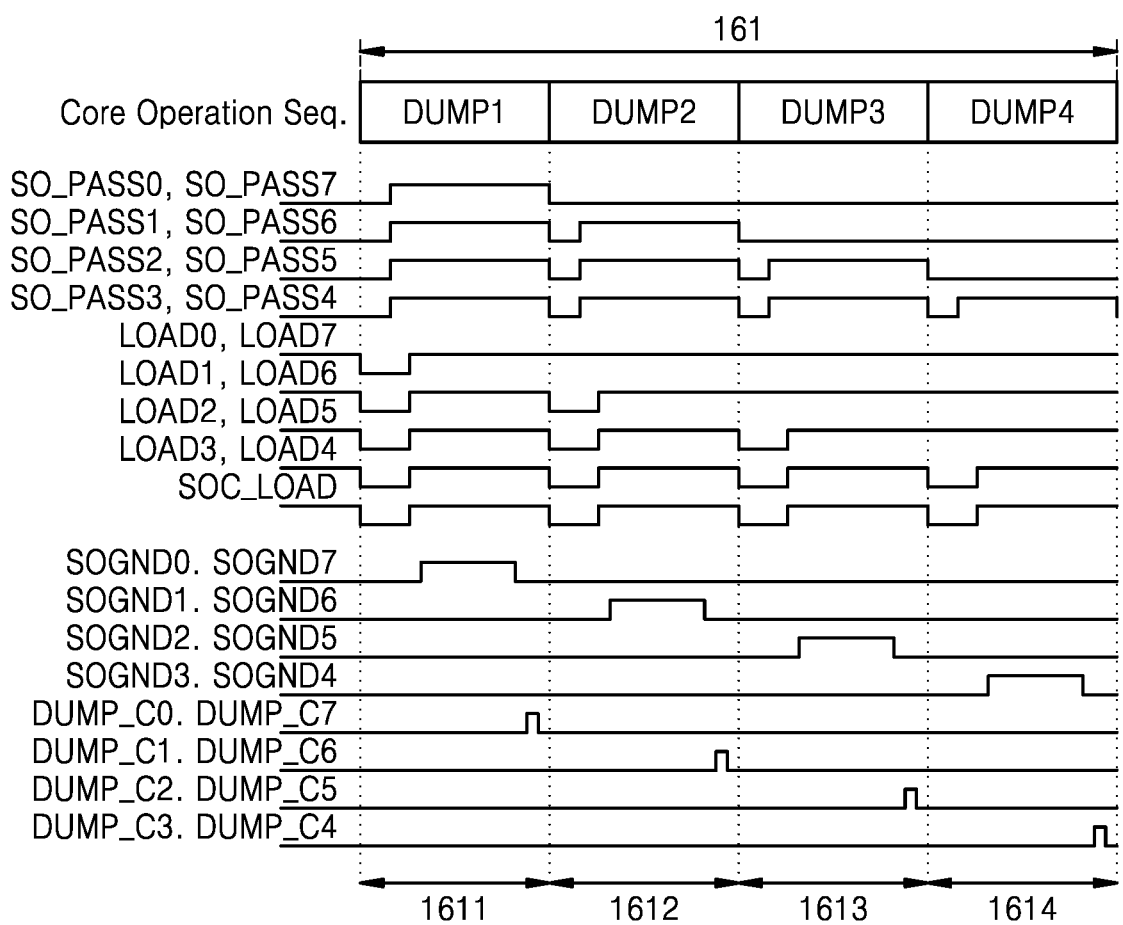
FIG. 15 is a timing diagram showing an example of a data transmission operation according to an embodiment.

FIG. 15 is a timing diagram showing an example of a data transmission operation according to an embodiment. Referring to FIGS. 12, 13, and 15 together, pass control signals SO_PASS0 to SO_PASS3 (i.e., SO_PASS[3:0]) may be applied to pass transistors TR0 to TR3 and TR0' to TR3' included in the first to fourth page buffer units PBU0 to PBU3, respectively, and pass control signals SO_PASS4 to SO_PASS7 (i.e., SO_PASS[7:4]) may be applied to pass transistors TR4 to TR7 and TR4' to TR7' included in the fifth to eighth page buffer units PBU4 to PBU7, respectively.

The core operation sequence may include a data transmission period 161 in which a data dumping operation is performed. When the page buffer circuit PGBUF has a multi-stage structure, the data transmission period 161 may be divided into the number of data transmission periods corresponding to half of the total number of stages. For example, when the page buffer circuit PGBUF has an 8-stage structure, the data transmission period 161 may be divided into four data transmission periods, e.g., first to fourth data transmission periods 1611 to 1614. First data transmission operations between upper page buffer units and upper cache units and second data transmission operations between lower page buffer units and lower cache units may be simultaneously performed. Here, the first data transmission operations may be sequentially performed, and the second data transmission operations may also be sequentially performed. Specifically, in each of the first to fourth data transmission periods 1611 to 1614, a data transmission operation between an upper page buffer unit and a upper cache unit corresponding thereto and a data transmission between a lower page buffer unit and a lower cache unit corresponding thereto may be performed simultaneously.

In a data transmission section 161, the first pass transistors TR0 to TR3 and the second pass transistors TR0' to TR3' respectively included in the first to fourth page buffer units PBU0 to PBU3 may be selectively turned on to individually control connections between the first to fourth page buffer units PBU0 to PBU3 and the first to fourth cache units CU0 to CU3. Also, in the data transmission section 161, the first pass transistors TR4 to TR7 and the second pass transistors TR4' to TR7' respectively included in the fifth to eighth page buffer units PBU4 to PBU7 may be selectively turned on to individually control connections between the fifth to eighth page buffer units PBU4 to PBU7 and the fifth to eighth cache units CU4 to CU7. Therefore, an amount of a current consumed in for a data dumping operation may be reduced.

In detail, in the first data transmission period 1611, all of first to eighth pass control signals SO_PASS0 to SO_PASS7 may be activated, and thus all of the first pass transistors TR0 to TR3 and the second pass transistors TR0' to TR3' respectively included in the first to fourth page buffer units PBU0 to PBU3 may be turned on and connected in series, and all of the first pass transistors TR4 to TR7 and the second pass transistors TR4' to TR7' respectively included in the fifth to eighth page buffer units PBU4 to PBU7 may be turned on and connected in series. Here, the first sensing node SO0 may be connected to the first combined sensing node SOC1 through second to fourth sensing nodes SO1 to SO3, and the eighth sensing node SO7 may be connected to the second combined sensing node SOC1' through fifth to seventh sensing nodes SO4 to SO6.

At the start of the first data transmission period 1611, load signals LOAD0 to LOAD7 may transition to logic low, which is an enable level, all of pre-charge transistors PM0 to PM7 respectively included in the first to eighth page buffer units PBU0 to PBU7 may be turned on, and first to eighth sensing nodes SO0 to SO7 may be pre-charged to a pre-charge level. Also, at the start of the first data transmission period 1611, the combined sensing node load signal SOC_LOAD may transition to logic low, which is an enable level, the pre-charge transistor PMa included in a pre-charge circuit SOC_PRE1 may be turned on, and the first combined sensing node SOC1 may be pre-charged to a pre-charge level. Similarly, the second combined sensing node SOC1' may also be pre-charged to a pre-charge level.

Subsequently, the load signals LOAD0 to LOAD7 and the combined sensing node load signal SOC_LOAD transition to logic high, and ground control signals SOGND0 and SOGND7, which are respectively applied to first and eighth page buffer units PBU0 and PBU7, may transition to logic high, which is an enable level. Here, the first sensing node SO0 and a sensing latch included in the first page buffer unit PBU0 may be electrically connected, and the eighth sensing node SO7 and a sensing latch included in the eighth page buffer unit PBU7 may be electrically connected.

Subsequently, the ground control signals SOGND0 and SOGND7 respectively applied to the first page buffer unit PBU0 and the eighth page buffer unit PBU7 transition to logic low, and dump signals DUMP_C0 and DUMP_C7 respective applied to the first cache unit CU0 and the eighth cache unit CU7 may transition to logic high, which is an enable level. Here, data may be dumped between the sensing latch included in the first page buffer unit PBU0 and the first cache unit CU0, and at the same time, data may be dumped between the sensing latch included in the eighth page buffer unit PBU7 and the eighth cache unit CU7. The above descriptions of the first data transmission period 1611 may also be applied to second to fourth data transmission periods 1612 to 1614.

In a second data transmission section 1612, the first pass control signal SO_PASS0 and an eighth pass control signal SO_PASS7 may be deactivated and second to seventh pass control signals SO_PASS1 to SO_PASS6 may be activated, and thus all of first pass transistors TR1 to TR3 and second pass transistors TR1 to TR3' included in second to fourth page buffer units PBU1 to PBU3 may be turned on and connected in series, and all of first pass transistors TR4 to TR6 and second pass transistors TR4' to TR6' included in fifth to seventh page buffer units PBU4 to PBU6 may be turned on and connected in series. Here, the second sensing node SO1 may be connected to the first combined sensing node SOC1 through the third sensing node SO2 and the fourth sensing node SO3, and data dumping may be performed between the main latch in the second page buffer unit PBU1 and a cache latch in a second cache unit CU1. Here, the seventh sensing node SO6 may be connected to the second combined sensing node SOC1' through the fifth sensing node SO4 and the sixth sensing node SO5, and data dumping may be performed between the main latch in the seventh page buffer unit PBU6 and a cache latch in the seventh cache unit CU6. Here, since first and second pass transistors TR0, TR0', TR7, and TR7' included in the first page buffer unit PBU0 and the eighth page buffer unit PBU7 are turned off, current consumption may be reduced.

In a third data transmission section 1613, first, second, seventh, and eighth pass control signals SO_PASS0, SO_PASS1, SO_PASS6, and SO_PASS7 may be deactivated and third to sixth pass control signals SO_PASS2 to SO_PASS5 may be activated, and thus all of first and second pass transistors TR2, TR3, TR2', and TR3' included in the third page buffer unit PBU2 and the fourth page buffer unit PBU3 may be turned on and connected in series, and all of first and second pass transistors TR4, TR5, TR4', and TR5' included in the fifth page buffer unit PBU4 and the sixth page buffer unit PBU5 may be turned on and connected in series. Here, the third sensing node SO2 may be connected to the first combined sensing node SOC1 through the fourth sensing node SO3, and data dumping may be performed between the main latch in the third page buffer unit PBU2 and a cache latch in a third cache unit CU2. Also, the sixth sensing node SO5 may be connected to the second combined sensing node SOC1' through the fifth sensing node SO4, and data dumping may be performed between the main latch in the sixth page buffer unit PBU5 and a cache latch in a sixth cache unit CU5. Here, since first and second pass transistors TR0, TR0', TR1, TR1', TR6, TR6', TR7, and TR7' included in first, second, seventh, and eighth page buffer units PBU0, PBU1, PBU6, and PBU7 are turned off, current consumption may be reduced.

In a fourth data transmission section 1614, first to third and sixth to eighth pass control signals SO_PASS0 to SO_PASS2 and SO_PASS5 to SO_PASS7 may be deactivated and fourth and fifth pass control signals SO_PASS3, SO_PASS4 may be activated, and thus the first pass transistor TR3 and the second pass transistor TR3' included in the fourth page buffer unit PBU3 may be turned on and connected in series, and a first pass transistor TR4 and a second pass transistor TR4' included in the fifth page buffer unit PBU4 may be turned on and connected in series. In this case, the fourth sensing node SO3 is connected to the first combined sensing node SOC1, and data dumping may be performed between the main latch in the fourth page buffer unit PBU3 and the cache latch in a fourth cache unit CU3. Also, the fifth sensing node SO4 is connected to the second combined sensing node SOC1', and data dumping may be performed between the main latch in the fifth page buffer unit PBU4 and the cache latch in the fifth cache unit CU4. Here, since first and second pass transistors TR0 to TR2, TR5 to TR7, TR0' to TR2', and TR5' to TR7' included in first to third and sixth to eighth page buffer units PBU0 to PBU2 and PBU5 to PBU7 are turned off, current consumption may be reduced.

Meanwhile, in a data sensing period in which a data sensing operation is performed in the core operation sequence, all of the first to eighth pass control signals SO_PASS0 to SO_PASS7 may be deactivated, and all the pass transistors TR0 to TR7 and TR0' to TR7' included in the first to eighth page buffer units PBU0 to PBU7 may be turned off. Therefore, the first to eighth page buffer units PBU0 to PBU7 may not be electrically connected to one another, and the first to eighth sensing nodes SO0 to SO7 may be insulated from one another. Here, the first to fourth sensing nodes SO0 to SO3 may not be electrically connected to the first combined sensing node SOC1, and the first to fourth page buffer units PBU0 to PBU3 may not be connected to the first to fourth cache units CU0 to CU3. Here, fifth to eighth sensing nodes SO4 to SO7 may not be electrically connected to the second combined sensing node SOC1', and the fifth to eighth page buffer units PBU4 to PBU7 may not be electrically connected to the fifth to eighth cache units CU4 to CU7.

Figure 16:
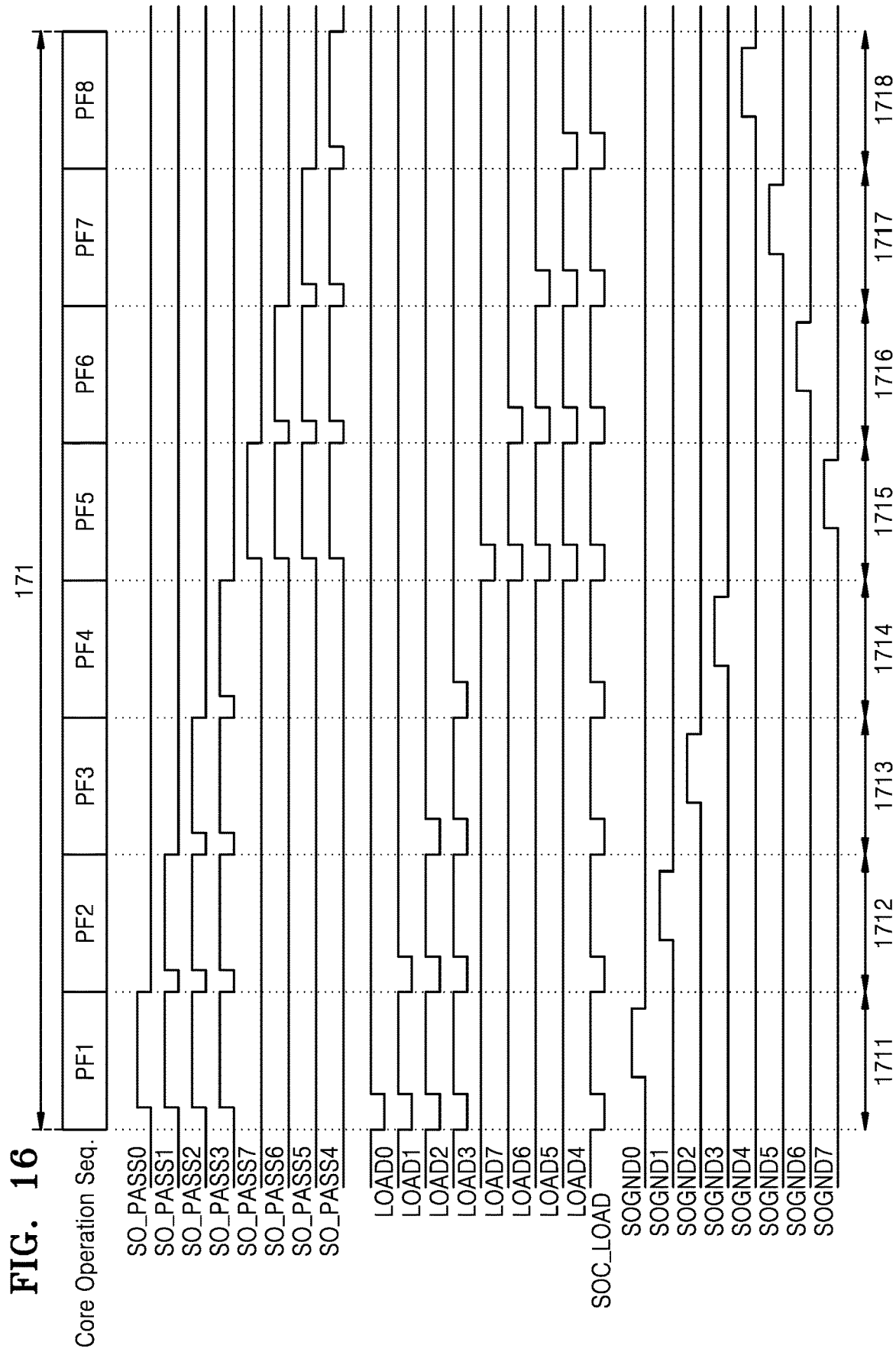
FIG. 16 is a timing diagram showing an example of a pass/fail determination operation according to an embodiment.

FIG. 16 is a timing diagram showing an example of a pass/fail determination operation according to an embodiment.

Referring to FIGS. 13 and 16 together, the core operation sequence may include a pass/fail determination period 171 in which a pass/fail determination operation is performed on data. For example, the pass/fail determination period 171 may be performed after the data transmission period 161 of FIG. 15. When the page buffer circuit PGBUF has a multi-stage structure, the pass/fail determination period 171 may be divided into pass/fail determination periods corresponding to respective stages. For example, when the page buffer circuit PGBUF has an 8-stage structure, the pass/fail determination period 171 may be divided into eight pass/fail determination periods, e.g., first to eighth pass/fail determination periods 1711 to 1718.

According to an embodiment, first pass/fail determination operations respectively corresponding to upper page buffer units may be sequentially performed, and then second pass/fail determination operations respectively corresponding to lower page buffer units may be sequentially performed. For example, first to fourth pass/fail determination periods 1711 to 1714 may correspond to a first period, and in the first period, first pass/fail determination operations for upper page buffer units may be sequentially performed. For example, fifth to eighth pass/fail determination periods 1715 to 1718 may correspond to a second period, and in the second period, second pass/fail determination operations for lower page buffer units may be sequentially performed.

In detail, in a first pass/fail determination section 1711, first to fourth pass control signals SO_PASS0 to SO_PASS3 may be activated, and fifth to eighth pass control signals SO_PASS4 to SO_PASS7 may be deactivated, and thus the first pass transistors TR0 to TR3 and the second pass transistors TR0' to TR3' included in the first to fourth page buffer units PBU0 to PBU3 may be turned on and connected in series, and the first pass transistors TR4 to TR7 and the second pass transistors TR4' to TR7' included in the fifth to eighth page buffer units PBU4 to PBU7 may be turned off. Here, the first sensing node SO0 is connected to the first combined sensing node SOC1 through the second to fourth sensing nodes SO1 to SO3, and a pass/fail determination operation regarding data stored in the sensing latch in the first page buffer unit PBU0 may be performed.

At the start of the first pass/fail determination period 1711, load signals LOAD0 to LOAD3 may transition to logic low, which is an enable level, all of pre-charge transistors PM0 to PM3 respectively included in the first to fourth page buffer units PBU0 to PBU3 may be turned on, and the first to fourth sensing nodes SO0 to SO3 may be pre-charged to a pre-charge level. Also, at the start of the first pass/fail determination period 1711, the combined sensing node load signal SOC_LOAD may transition to logic low, which is an enable level, the pre-charge transistor PMa included in the pre-charge circuit SOC_PRE1 may be turned on, and the first combined sensing node SOC1 may be pre-charged to a pre-charge level. Subsequently, the load signals LOAD0 to LOAD3 and the combined sensing node load signal SOC_LOAD transition to logic high, and a ground control signal SOGND0, which is applied to the first page buffer unit PBU0, may transition to logic high, which is an enable level. At this time, the first sensing node SO0 and the sensing latch included in the first page buffer unit PBU0 may be electrically connected. The above descriptions of the first pass/fail determination period 1711 may also be applied to second to eighth pass/fail determination periods 1712 to 1718.

In a second pass/fail determination section 1712, second to fourth pass control signals SO_PASS1 to SO_PASS3 may be activated, and first and fifth to eighth pass control signals SO_PASS0 and SO_PASS4 to SO_PASS7 may be deactivated, and thus first pass transistors TR1 to TR3 and the second pass transistors TR1' to TR3' included in the second to fourth page buffer units PBU1 to PBU3 may be turned on and connected in series, and the first pass transistors TR0 and TR4 to TR7 and the second pass transistors TR0' and TR4' to TR7' included in the first and fifth to eighth page buffer units PBU0 and PBU4 to PBU7 may be turned off. Here, the second sensing node SO1 is connected to the first combined sensing node SOC1 through the third and fourth sensing nodes SO2 and SO3, and a pass/fail determination operation regarding data stored in the sensing latch in the second page buffer unit PBU1 may be performed.

In a third pass/fail determination section 1713, third and fourth pass control signals SO_PASS2 and SO_PASS3 may be activated, and first, second, and fifth to eighth pass control signals SO_PASS0, SO_PASS1, and SO_PASS4 to SO_PASS7 may be deactivated, and thus first pass transistors TR2 and TR3 and the second pass transistors TR2' and TR3' included in the third and fourth page buffer units PBU2 to PBU3 may be turned on and connected in series, and the first pass transistors TR0, TR1, and TR4 to TR7 and the second pass transistors TR0', TR1', and TR4' to TR7' included in the first, second, and fifth to eighth page buffer units PBU0, PBU1, and PBU4 to PBU7 may be turned off. Here, the third sensing node SO2 is connected to the first combined sensing node SOC1 through the fourth sensing node SO3, and a pass/fail determination operation regarding data stored in the sensing latch in the third page buffer unit PBU2 may be performed.

In a fourth pass/fail determination section 1714, a fourth pass control signal SO_PASS3 may be activated, and first to third and fifth to eighth pass control signals SO_PASS0 to SO_PASS2 and SO_PASS4 to SO_PASS7 may be deactivated, and thus the first pass transistor TR3 and the second pass transistor TR3' included in the fourth page buffer unit PBU3 may be turned on and connected in series, and first pass transistors TR0 to TR2 and TR4 to TR7 and second pass transistors TR0' to TR2' and TR4' to TR7' included in the first to third and fifth to eighth page buffer units PBU0 to PBU2 and PBU4 to PBU7 may be turned off. Here, the fourth sensing node SO3 is connected to the first combined sensing node SOC1, and a pass/fail determination operation regarding data stored in the sensing latch in the fourth page buffer unit PBU3 may be performed.

In a fifth pass/fail determination period 1715, the first to fourth pass control signals SO_PASS0 to SO_PASS3 may be deactivated and the fifth to eighth pass control signals SO_PASS4 to SO_PASS7 may be activated, and thus a pass/fail determination operation regarding data stored in the sensing latch in the eighth page buffer unit PBU7 may be performed. In a sixth pass/fail determination period 1716, first to fourth and eighth pass control signals SO_PASS0 to SO_PASS4 and SO_PASS7 may be deactivated and fifth to seventh pass control signals SO_PASS4 to SO_PASS6 may be activated, and thus a pass/fail determination operation regarding data stored in the sensing latch in the seventh page buffer unit PBU6 may be performed.

In a seventh pass/fail determination period 1717, first to fourth, seventh, and eighth pass control signals SO_PASS0 to SO_PASS3, SO_PASS6, and SO_PASS7 may be deactivated and fifth and sixth pass control signals SO_PASS4 and SO_PASS5 may be activated, and thus a pass/fail determination operation regarding data stored in the sensing latch in the sixth page buffer unit PBU5 may be performed. In an eighth pass/fail determination period 1718, first to fourth and sixth to eighth pass control signals SO_PASS0 to SO_PASS3 and SO_PASS5 to SO_PASS7 may be deactivated and a fifth pass control signal SO_PASS4 may be activated, and thus a pass/fail determination operation regarding data stored in the sensing latch in the fifth page buffer unit PBU4 may be performed.

Figure 17:
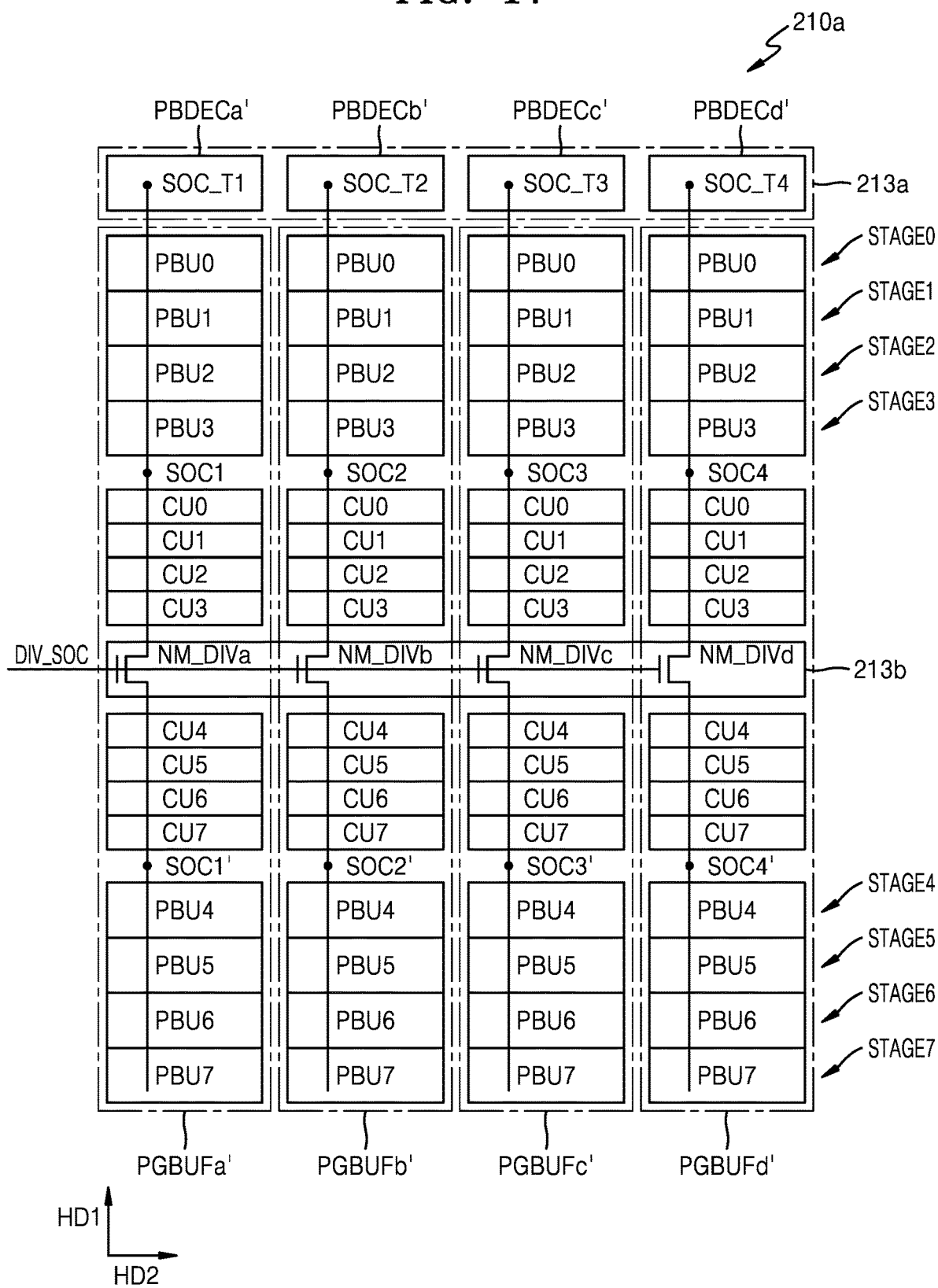
FIG. 17 is a diagram showing a page buffer circuit and a page buffer decoder according to an embodiment.

FIG. 17 is a diagram showing a page buffer circuit 210*a* and a PBDEC 213*a* according to an embodiment. The present embodiment corresponds to an modified example of FIG. 10, and the descriptions given above with reference to FIG. 10 may also be applied to the present embodiment.

Referring to FIG. 17, the PBDEC 213*a* may include first to fourth PBDECs PBDECa' to PBDECd', and the first to fourth PBDECs PBDECa' to PBDECd' may be arranged to correspond to first page buffer units PBU0 of first to fourth page buffer circuits PGBUFa' to PGBUFd', respectively. An input/output driver 213*b* may be disposed at the center of the page buffer circuit 210*a*, and more particularly, between the fourth cache unit CU3 and the fifth cache unit CU4 of each of the first to fourth page buffer circuits PGBUFa' to PGBUFd'. The input/output driver 213*b* may control input/output signals for cache latches included in the first to eighth cache units CU0 to CU7.

For example, the input/output driver 213*b* may include transistors NM_DIVa to NM_DIVd driven by a segmentation control signal or a division control signal DIV_SOC. When the division control signal DIV_SOC is at a logic high level, the transistors NM_DIVa to NM_DIVd may be turned on, and thus the fifth to eighth cache units CU4 to CU7 and the fifth to eighth page buffer units PBU4 to PBU7 may be connected to the PBDEC 213*a* together with the first to fourth page buffer units PBU0 to PBU3 and the first to fourth cache units CU0 to CU3. Meanwhile, when the division control signal DIV_SOC is at a logic low level, the transistors NM_DIVa to NM_DIVd may be turned off, and thus the fifth to eighth cache units CU4 to CU7 and the fifth to eighth page buffer units PBU4 to PBU7 may not be connected to the PBDEC 213*a*.

A first PBDEC PBDECa' may be connected to the first combined sensing node SOC1 and/or the second combined sensing node SOC1' through an upper combined sensing node SOC_T1. A second PBDEC PBDECb' may be connected to the first combined sensing node SOC2 and/or the second combined sensing node SOC2' through an upper combined sensing node SOC_T2. A third PBDEC PBDECc' may be connected to the first combined sensing node SOC3 and/or the second combined sensing node SOC3' through an upper combined sensing node SOC_T3. A fourth PBDEC PBDECd' may be connected to the first combined sensing node SOC4 and/or the second combined sensing node SOC4' through an upper combined sensing node SOC_T4.

Figure 18:
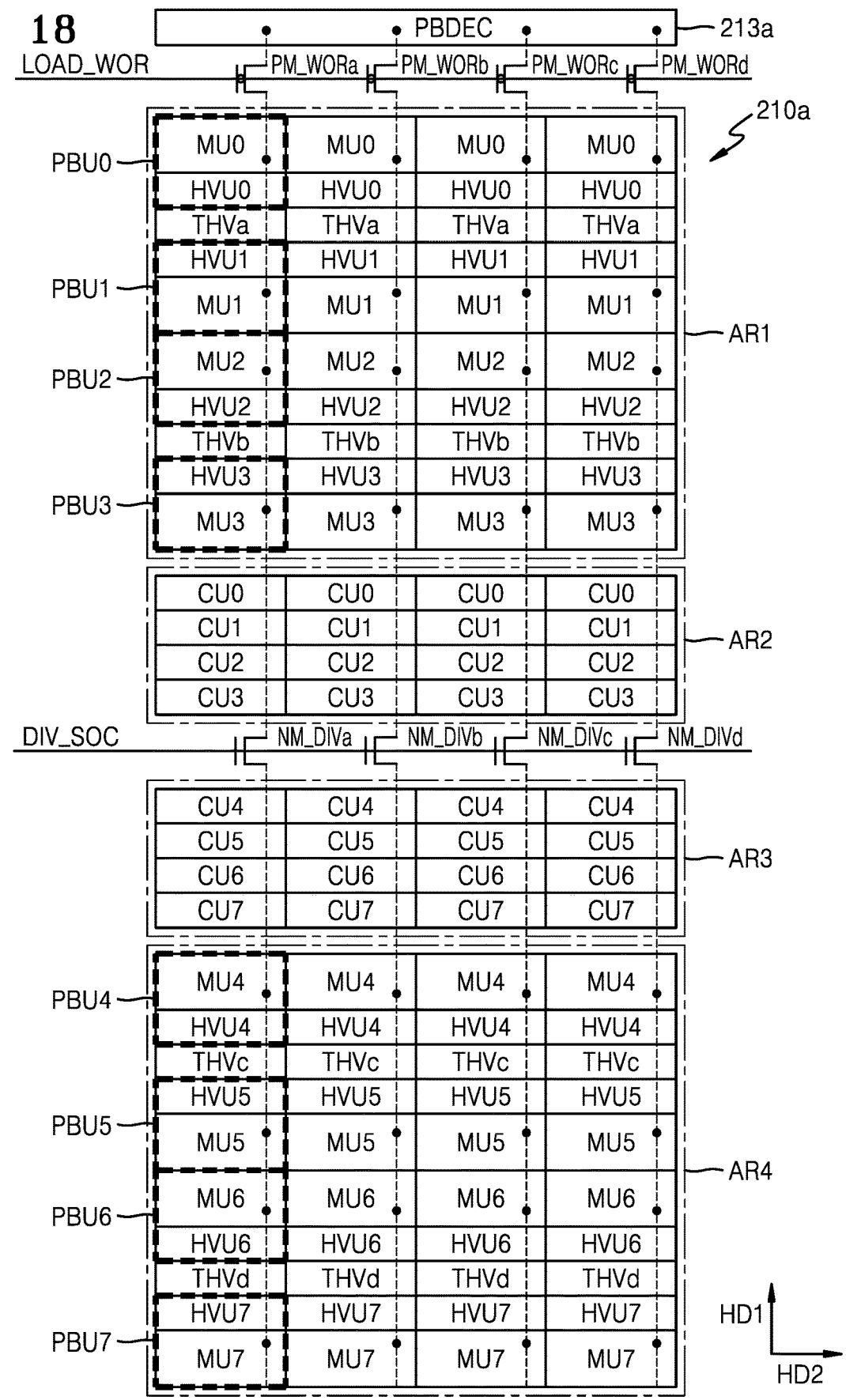
FIG. 18 is a diagram showing a page buffer circuit and a page buffer decoder according to an embodiment in more details.

FIG. 18 is a diagram showing the page buffer circuit 210*a* and the PBDEC 213*a* according to an embodiment in more details. The present embodiment corresponds to a modified example of FIGS. 11 and 17, and redundant descriptions will be omitted. Referring to FIG. 18, transistors PM_WORa to PM_WORd driven by a load WOR control signal LOAD_WOR may be arranged between the PBDEC 213*a* and the page buffer circuit 210*a*. When the load WOR control signal LOAD_WOR is at a logic low level, the transistors PM_WORa to PM_WORd may be turned on, and the page buffer circuit 210*a* and the PBDEC 213*a* may be connected. On the other hand, when the load WOR control signal LOAD_WOR is at a logic high level, the transistors PM_WORa to PM_WORd may be turned off, and the page buffer circuit 210*a* and the PBDEC 213*a* may not be connected.

Figure 19:
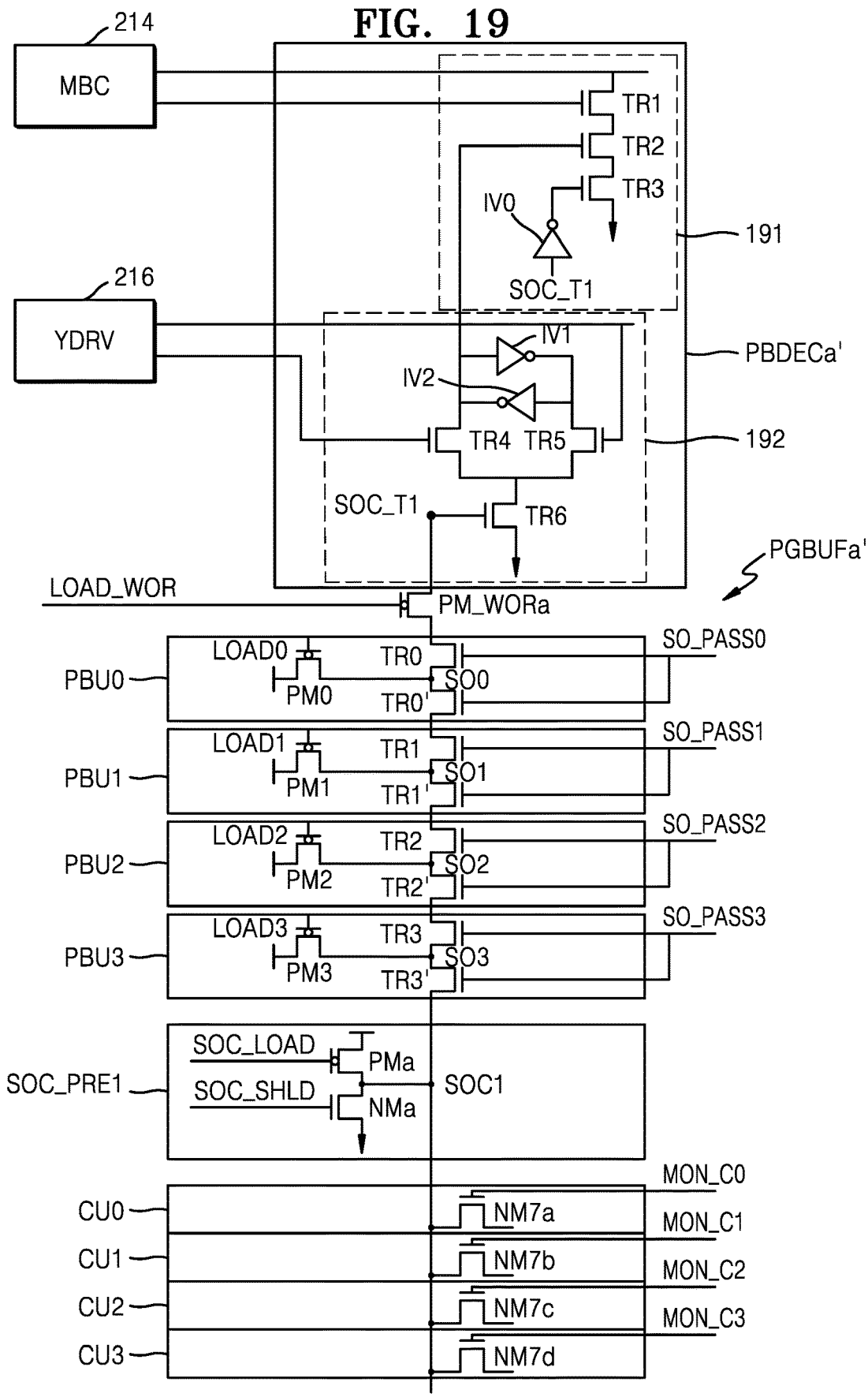
FIG. 19 is a circuit diagram showing the partial area of a page buffer circuit according to an embodiment.

FIG. 19 is a circuit diagram showing a partial region of the page buffer circuit PGBUFa' and the PBDEC PBDECa' according to an embodiment.

Referring to FIG. 19, the PBDEC PBDECa' may include an MBC current branch 191 and a WOR latch 192. The WOR latch 192 may store column repair information. Here, the column repair information may be column repair information corresponding to the first page buffer circuit PGBUFa'. The MBC current branch 191 may provide a value corresponding to the number of pieces of latch data (logic high or logic low) of each page buffer unit to the MBC 214, and thus the MBC 214 may perform digital-to-analog conversion.

The MBC current branch 191 may include transistors TR1, TR2, and TR3 connected in series and an inverter IV0, and an input terminal of the inverter IV0 may be connected to the upper combined sensing node SOC_T1. The WOR latch 192 may include inverters IV1 and IV2 and transistors TR4, TR5 and TR6, wherein the inverters IV1 and IV2 may constitute a latch. A gate of a transistor TR1 may be connected to the MBC 214 and may receive a control signal from the MBC 214. A gate of the transistor TR2 may be connected to an input terminal of the inverter IV1 and an output terminal of the inverter IV2. Gates of transistors TR4 and TR5 may be connected to a Y driver 216 and each receive a control signal from the Y driver 216. A gate of a transistor TR6 may be connected to the upper combined sensing node SOC_T1.

Figure 20:
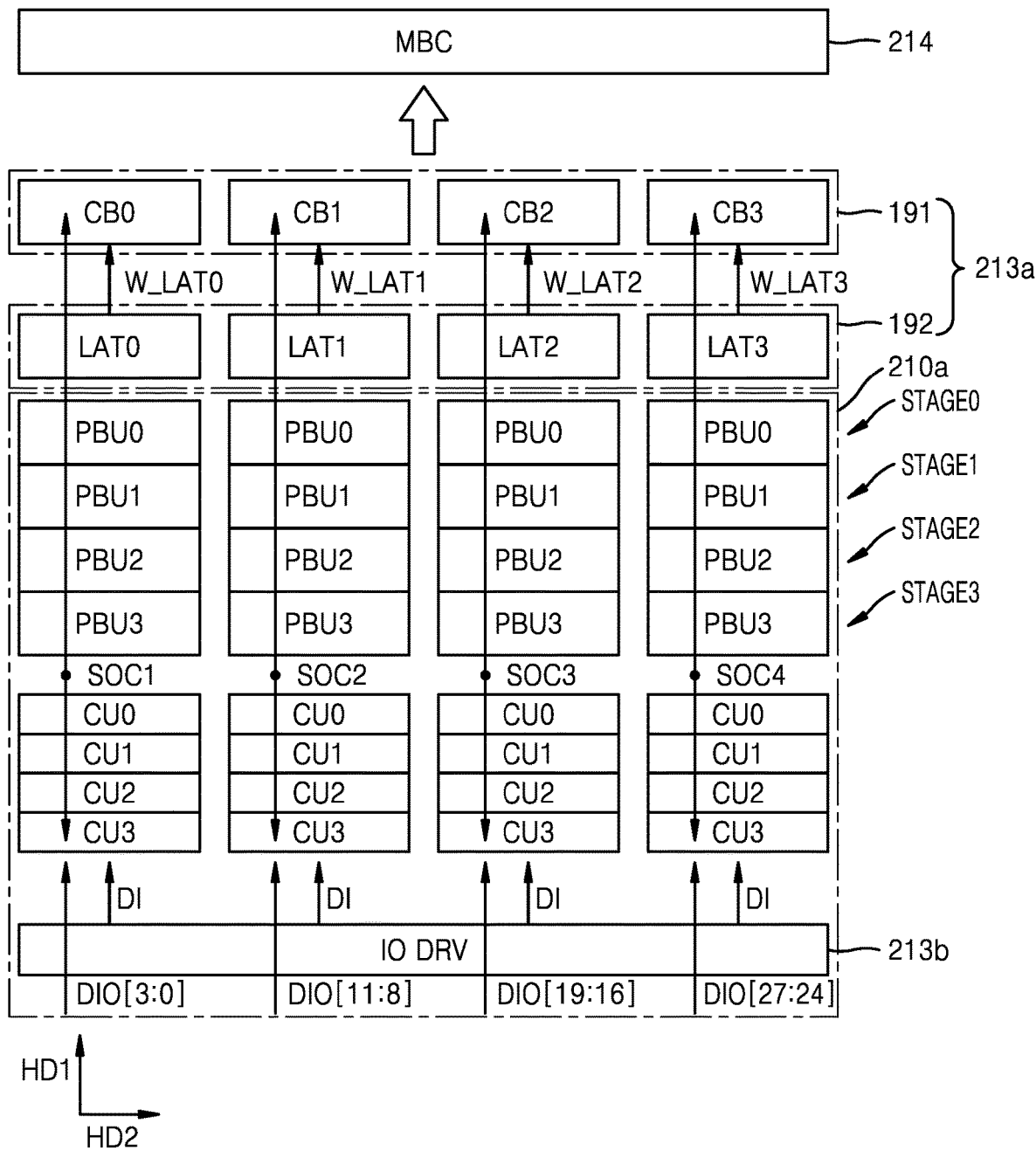
FIG. 20 is a circuit diagram showing a partial region of a page buffer circuit and a page buffer decoder according to an embodiment.

FIG. 20 is a circuit diagram showing a partial region of the page buffer circuit 210*a* and the PBDEC 213*a* according to an embodiment. Referring to FIG. 20, the MBC current branch 191 may include current branches CB0 to CB3, and the current branches CB0 to CB3 may be connected to the MBC 214. The WOR latch 192 may include latches LAT0 to LAT3, and the latches LAT0 to LAT3 may transmit latch information W_LAT0 to W_LAT3 to the current branches CB0 to CB3, respectively. WOR latch information may be updated in one (e.g., CU3) of the first to fourth cache units CU0 to CU3 through the input/output driver 213*b*, and WOR latch information may be transmitted to a WOR latch (e.g., LAT0) through the first combined sensing node SOC1.

Figure 21:
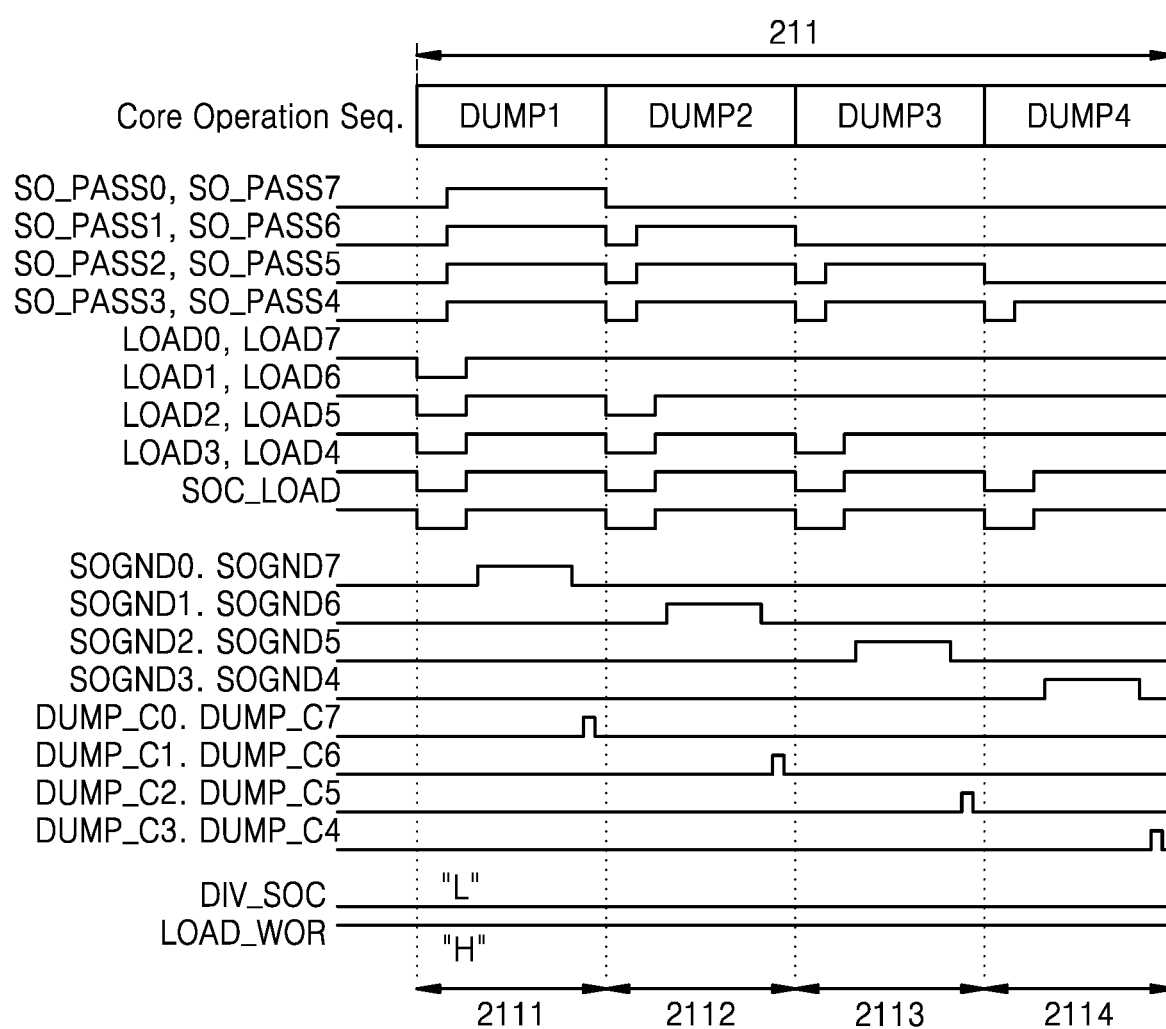
FIG. 21 is a timing diagram showing an example of a data transmission operation according to an embodiment.

FIG. 21 is a timing diagram showing an example of a data transmission operation according to an embodiment. The present embodiment corresponds to a modified example of FIG. 15, and redundant descriptions will be omitted. Referring to FIGS. 17 to 21, the core operation sequence may include a data transmission period 211 in which a data dumping operation is performed. The data transmission period 211 may include first to fourth data transmission periods 2111 to 2114. The first to fourth data transmission periods 2111 to 2114 may correspond to the first to fourth data transmission periods 1611 to 1614 of FIG. 15, respectively. In the first to fourth data transmission periods 2111 to 2114, the division control signal DIV_SOC may maintain a logic low level, and thus all of the transistors NM_DIVa to NM_DIVd may be turned off. In the first to fourth data transmission periods 2111 to 2114, a WOR control signal LOAD_WOR may maintain a logic high level, and thus all of transistors NM_WORa to NM_WORd may be turned off.

Figure 22:
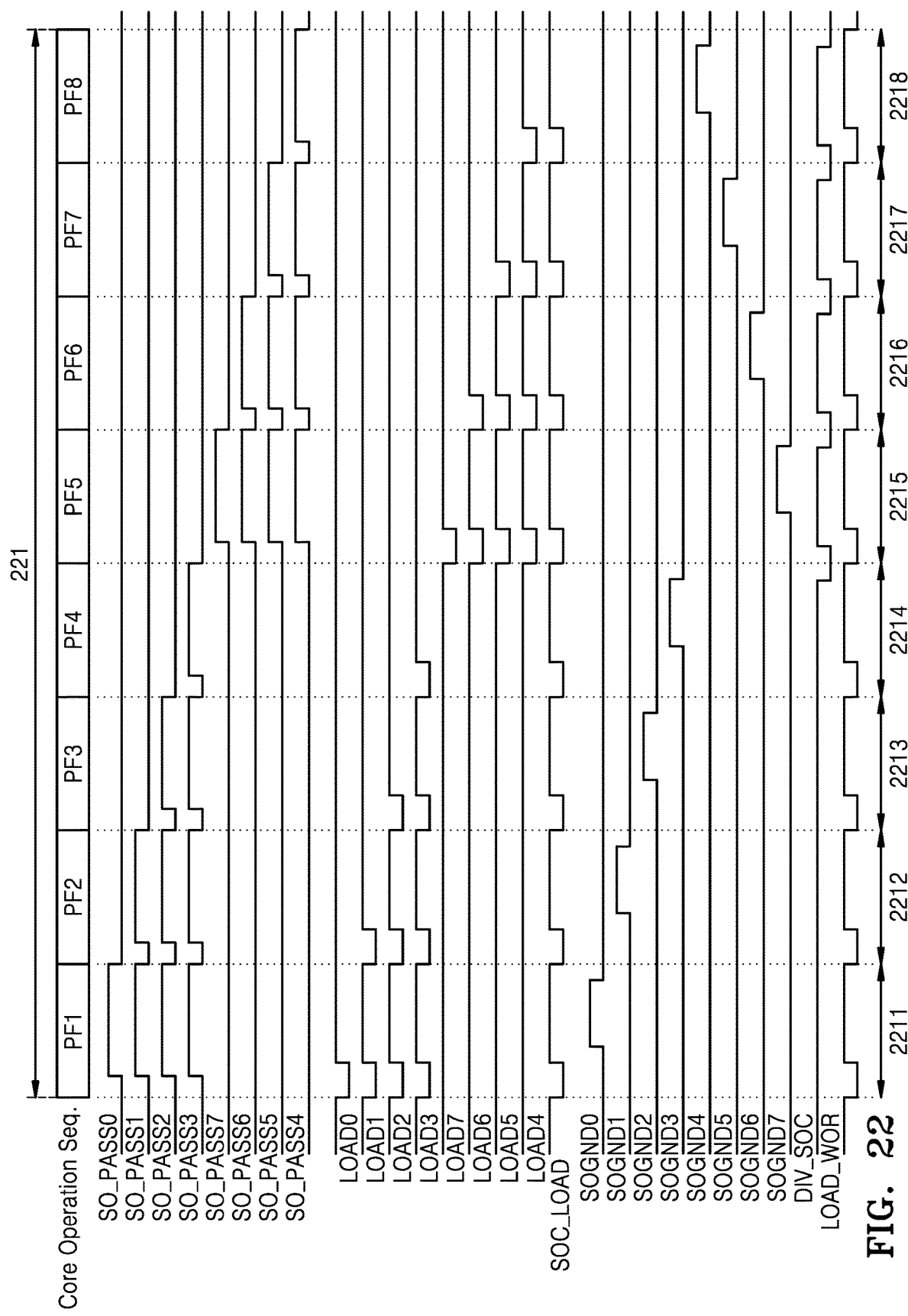
FIG. 22 is a timing diagram showing an example of a pass/fail determination operation according to an embodiment.

FIG. 22 is a timing diagram showing an example of a pass/fail determination operation according to an embodiment. The present embodiment corresponds to a modified example of FIG. 16, and redundant descriptions will be omitted. Referring to FIGS. 17 to 20 and 22 together, the core operation sequence may include a pass/fail determination period 221 in which a pass/fail determination operation is performed on data. For example, the pass/fail determination period 2211 may be performed after the data transmission period 211 of FIG. 21. The pass/fail determination period 221 may include first to eighth pass/fail determination periods 2211 to 2218. The first to eighth pass/fail determination periods 2211 to 2218 may correspond to the first to eighth pass/fail determination periods 1711 to 1718 of FIG. 16, respectively.

In the first to fourth pass/fail determination periods 2211 to 2214, the division control signal DIV_SOC may maintain a logic low level, and thus all of the transistors NM_DIVa to NM_DIVd may be turned off. Meanwhile, in each of fifth to eighth pass/fail determination periods 2215 to 2218, the division control signal DIV_SOC may be activated. For example, in a fifth pass/fail determination section 2215, the division control signal DIV_SOC may transition to a logic high level when pass control signals SO_PASS<4> to SO_PASS<7> transition from a logic low level to a logic high level and may transition to the logic high level when a ground control signal SOGND<7> transitions from the logic high level to the logic low level. The transistors NM_DIVa to NM_DIVd are turned on while the division control signal DIV_SOC is maintaining the logic high level, and thus the fifth to eighth page buffer units PBU4 to PBU7 may be connected to the PBDEC 213a, and a pass/fail determination operation corresponding to the eighth page buffer unit PBU7 may be performed.

At the start of a first pass/fail determination period 2211, the WOR control signal LOAD_WOR may transition to a logic low level, which is an enable level, and the transistors PM_WORa to PM_WORd may be turned on. At this time, the first combined sensing node SOC1 and the upper combined sensing node SOC_T1 may be electrically connected. Subsequently, the WOR control signal LOAD_WOR may transition to a logic high level, which is a disable level, and the transistors PM_WORa to PM_WORd may be turned off.

Figure 23:
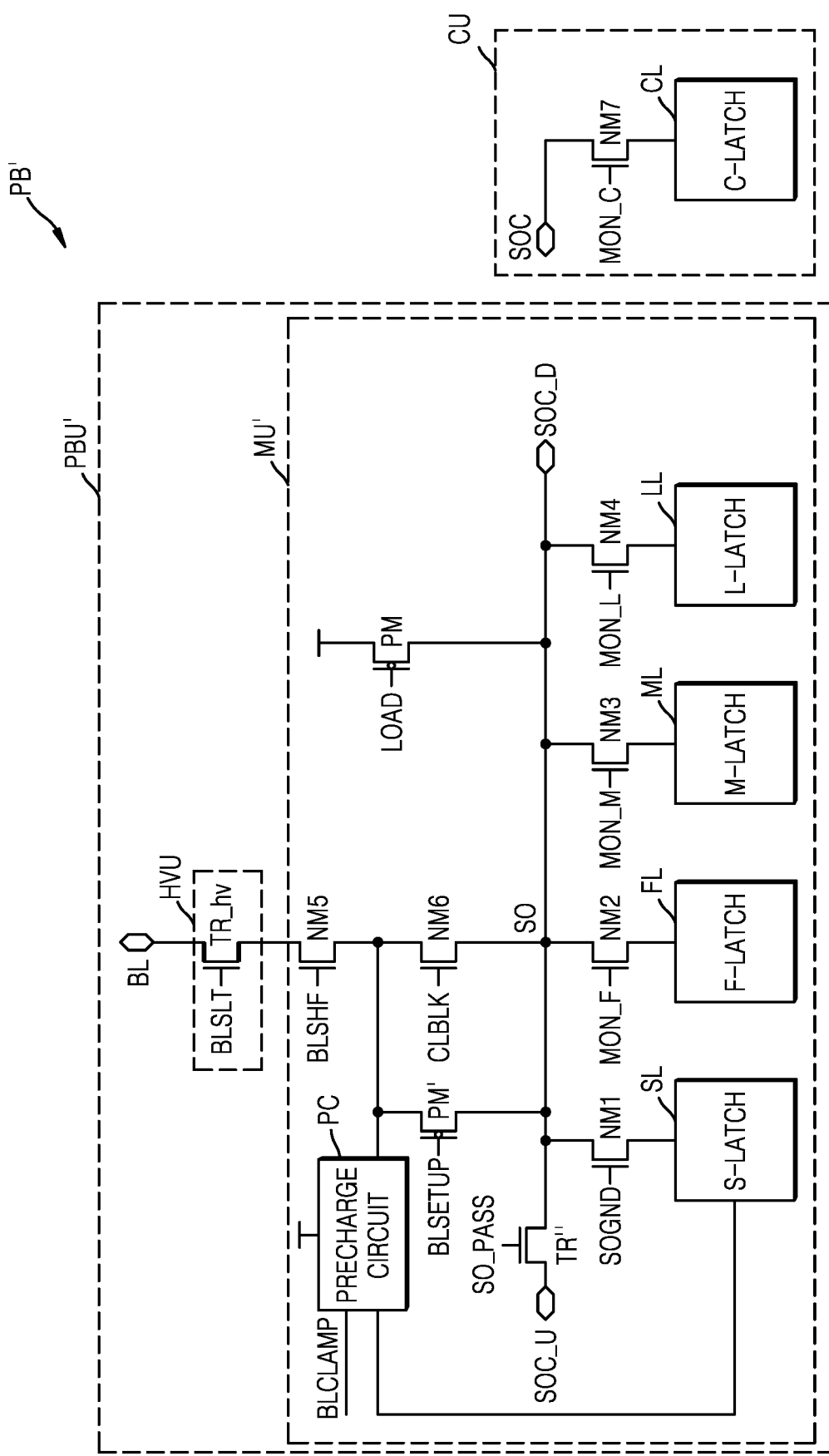
FIG. 23 is a circuit diagram showing a page buffer according to an embodiment.

FIG. 23 is a circuit diagram showing a page buffer PB' according to an embodiment. Referring to FIG. 23, the page buffer PB' may include a page buffer unit PBU' and the cache unit CU, and the page buffer unit PBU' may include a main unit MU' and the high-voltage unit HVU. The page buffer PB' may correspond to a modified example of the page buffer PB of FIG. 6. The page buffer unit PBU of FIG. 6 includes first and second pass transistors TR and TR', whereas the page buffer unit PBU' according to the present embodiment may include one pass transistor TR". The pass transistor TR" may be driven according to the pass control signal SO_PASS and may be connected between the first terminal SOC_U and the second terminal SOC_D.

For example, a source of the pass transistor TR" may be connected to the first terminal SOC_U, and a drain of the pass transistor TR" may be connected to the sensing node SO and the second terminal SOC_D. However, the inventive concept is not limited thereto, and the source of the pass transistor TR" may be connected to the first terminal SOC_U and the sensing node SO, and the drain of the pass transistor TR" may be connected to the second terminal SOC_D. According to an embodiment, a pass transistor included in one of two page buffer units adjacent to each other in the first direction HD1 may be connected between the first terminal SOC_U and the sensing node SO, and a pass transistor included in the other one page buffer unit may be connected between the sensing node SO and the second terminal SOC_D.

Figure 24:
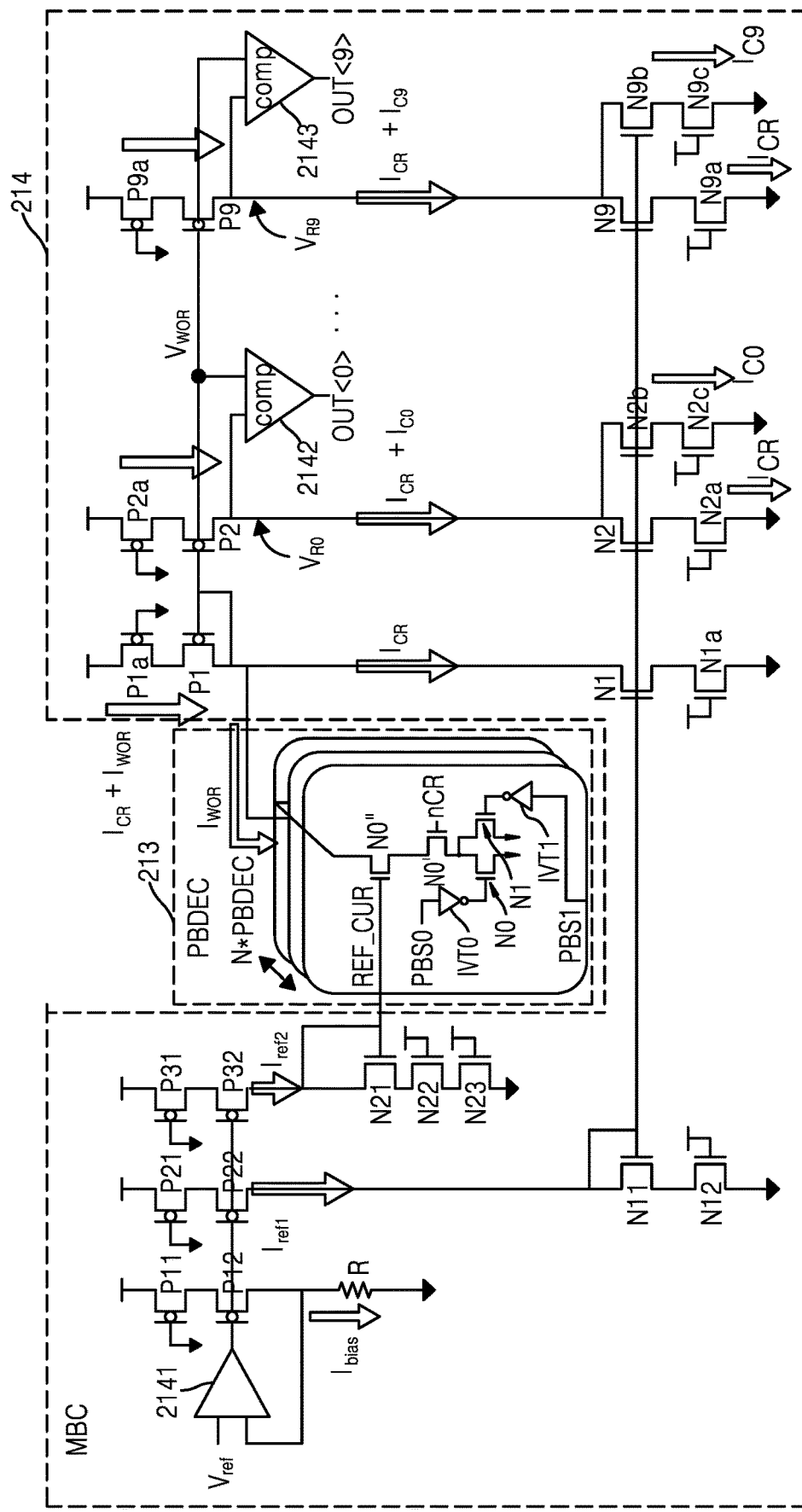
FIG. 24 is a diagram showing a page buffer decoder and a mass bit counter according to an embodiment.

FIG. 24 is a diagram showing the PBDEC 213 and the MBC 214 according to an embodiment. Referring to FIGS. 1, 9, and 24 together, the PBDEC 213 may include N PBDECs. Here, N is a positive integer and may correspond to the number of page buffer columns included in a page buffer circuit. Each PBDEC may include inverters IVT0 and IVT1 and transistors N0, N0', N0", and N1, and the transistor N0' may be referred to as a column enable transistor. Descriptions given above with reference to FIGS. 12 and 13 may be applied to the present embodiment. The MBC 214 may be connected to the wired OR terminal WOR_OUT connected to the N PBDECs.

The MBC 214 may generate count results CNT (i.e., OUT<0> to OUT<9>), which are digital values corresponding to the number of fail bits, from the analog level decoder output signal DS, that is, a current signal IWOR. In detail, the MBC 214 may include a plurality of transistors P11, P12, P21, P22, P31, P32, N11, N12, N21, N22, and N23, a resistor R, and a differential amplifier 2141 constituting a reference current generator. Also, the MBC 214 may further include a plurality of transistors P1, P1a, P2, P2a, P9, P9a, N1, N1a, N2, N2a, N2b, N2c, N9, N9a, N9b, and N9c constituting a counter and a plurality of comparators 2142 and 2143. In a period in which the operation of the MBC 214 is enabled, the transistors P11, P21, P31, N12, N23, P1a, P2a, P9a, N1a, N2a, N2c, N9a, and N9c may be turned on. On the other hand, in a period in which the operation of the MBC 214 is disabled, the transistors P11, P21, P31, N12, N23, P1a, P2a, P9a, N1a, N2a, N2c, N9a, and N9c may be turned off.

A reference voltage Vref may be input to a first input terminal of the differential amplifier 2141, and a voltage across the resistor R may be input to a second input terminal of the differential amplifier 2141. Transistors P11 and P12 and the resistor R may constitute a feedback variable resistor, and a bias current Ibias may flow through the resistor R. Transistors P21, P22, N12, and N21 may constitute a first reference current generator generating a first reference current Iref1, and transistors P31, P32, N21, N22, and N23 may constitute a second reference current generator generating a second reference current Iref2. A node voltage between transistors P32 and N21 may be provided from the second reference current generator to the PBDEC 213 as the reference current signal REF_CUR.

Figure 25:
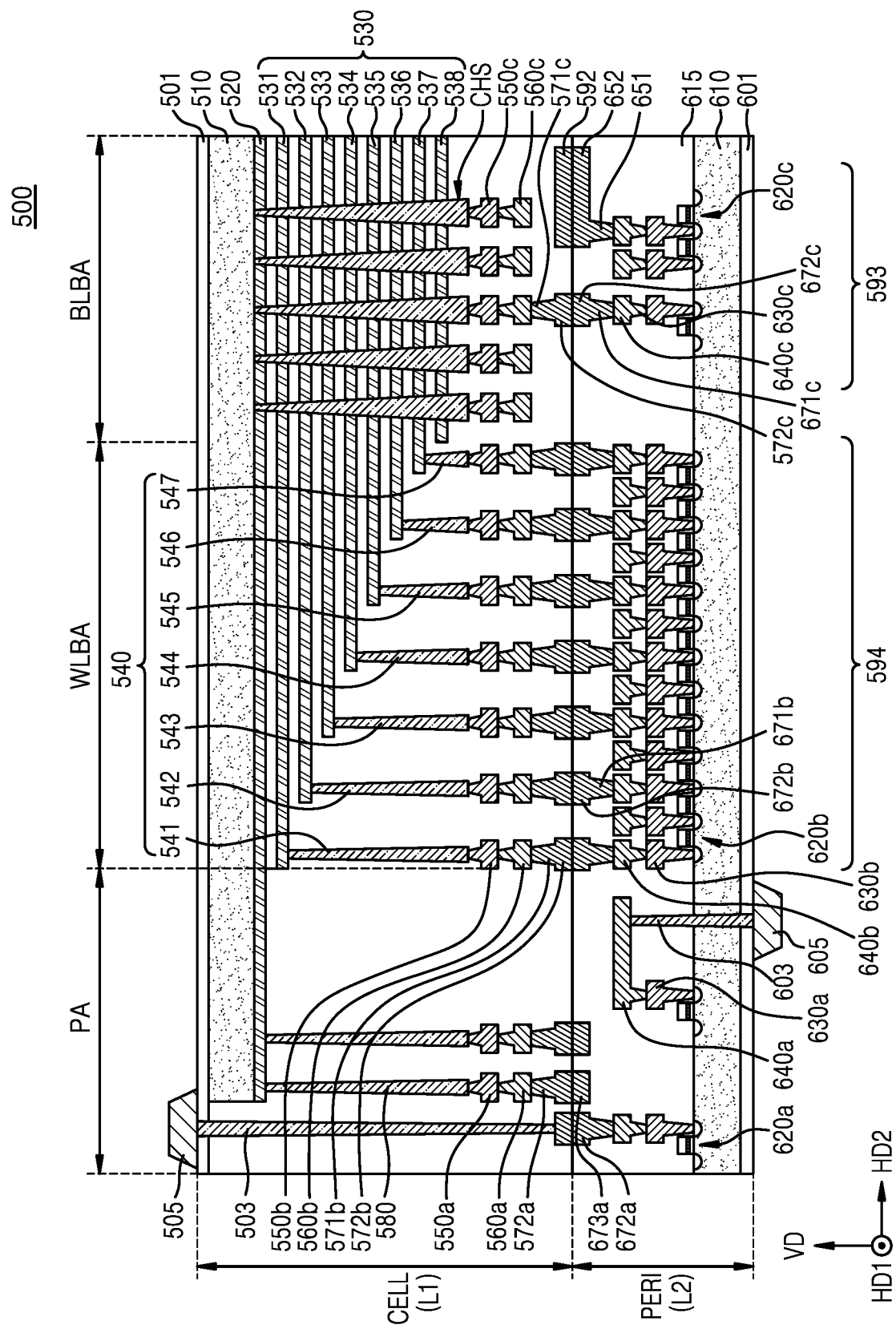
FIG. 25 is a cross-sectional view of a memory device having a bonding vertical NAND (B-VNAND) structure, according to an embodiment.

FIG. 25 is a cross-sectional view of a memory device 500 having a bonding vertical NAND (B-VNAND) structure, according to an embodiment. When a non-volatile memory included in a memory device is implemented as a bonding vertical NAND (B-VNAND) type flash memory, the non-volatile memory may have the structure shown in FIG. 25.

Referring to FIG. 25, a cell region CELL of a memory device 500 may correspond to a first semiconductor layer L1, and a peripheral circuit region PERI may correspond to a second semiconductor layer L2. The peripheral circuit region PERI and the cell region CELL of the memory device 500 may each include an external pad bonding area PA, a word line bonding area WLBA, and a bit line bonding area BLBA. For example, the word lines WL, the string select lines SSL, the ground select lines GSL, and the memory cell array 110 of FIG. 2 may be formed on the first semiconductor layer L1, whereas the control logic circuit 120, the page buffer circuit 130, the voltage generator 140, and the row decoder 150 may be formed on the second semiconductor layer L2.

The peripheral circuit region PERI may include a first substrate 610, an interlayer insulating layer 615, a plurality of circuit elements 620a, 620b, and 620c formed on the first substrate 610, first metal layers 630a, 630b, and 630c respectively connected to the plurality of circuit elements 620a, 620b, and 620c, and second metal layers 640a, 640b, and 640c formed on the first metal layers 630a, 630b, and 630c. In an embodiment, the first metal layers 630a, 630b, and 630c may be formed of tungsten having relatively high resistivity, and the second metal layers 640a, 640b, and 640c may be formed of copper having relatively low resistivity.

In an embodiment, although only the first metal layers 630a, 630b, and 630c and the second metal layers 640a, 640b, and 640c are shown and described, the embodiment is not limited thereto, and one or more additional metal layers may be further formed on the second metal layers 640a, 640b, and 640c. At least a portion of the one or more additional metal layers formed on the second metal layers 640a, 640b, and 640c may be formed of aluminum or the like having a lower resistivity than those of copper forming the second metal layers 640a, 640b, and 640c.

The interlayer insulating layer 615 may be disposed on the first substrate 610 and cover the plurality of circuit elements 620a, 620b, and 620c, the first metal layers 630a, 630b, and 630c, and the second metal layers 640a, 640b, and 640c. The interlayer insulating layer 615 may include or be formed of an insulating material such as silicon oxide, silicon nitride, or the like.

Lower bonding metals 671b and 672b may be formed on the second metal layer 640b in the word line bonding area WLBA. In the word line bonding area WLBA, the lower bonding metals 671b and 672b in the peripheral circuit region PERI may be electrically bonded to upper bonding metals 571b and 572b of the cell region CELL. The lower bonding metals 671b and 672b and the upper bonding metals 571b and 572b may be formed of aluminum, copper, tungsten, or the like. Further, the upper bonding metals 571b and 572b in the cell region CELL may be referred as first metal pads and the lower bonding metals 671b and 672b in the peripheral circuit region PERI may be referred as second metal pads.

The cell region CELL may include at least one memory block. The cell region CELL may include a second substrate 510 and a common source line 520. On the second substrate 510, a plurality of word lines 531 to 538 (i.e., 530) may be stacked in a vertical direction VD, perpendicular to an upper surface of the second substrate 510. At least one string select line and at least one ground select line may be arranged on and below the plurality of word lines 530, respectively, and the plurality of word lines 530 may be disposed between the at least one string select line and the at least one ground select line.

In the bit line bonding area BLBA, a channel structure CH may extend in the vertical direction VD, perpendicular to the upper surface of the second substrate 510, and pass through the plurality of word lines 530, the at least one string select line, and the at least one ground select line. The channel structure CH may include a data storage layer, a channel layer, a buried insulating layer, and the like, and the channel layer may be electrically connected to a first metal layer 550c and a second metal layer 560c. For example, the first metal layer 550c may be a bit line contact, and the second metal layer 560c may be a bit line. In an embodiment, the bit line 560c may extend in a second horizontal direction HD2, parallel to the upper surface of the second substrate 510.

In an embodiment, an area in which the channel structure CH, the bit line 560c, and the like are disposed may be defined as the bit line bonding area BLBA. In the bit line bonding area BLBA, the bit line 560c may be electrically connected to the circuit elements 620c providing a page buffer 593 in the peripheral circuit region PERI. The bit line 560c may be connected to upper bonding metals 571c and 572c in the cell region CELL, and the upper bonding metals 571c and 572c may be connected to lower bonding metals 671c and 672c connected to the circuit elements 620c of the page buffer 593.

In the word line bonding area WLBA, the plurality of word lines 530 may extend in a first horizontal direction HD1, parallel to the upper surface of the second substrate 510, and may be connected to a plurality of cell contact plugs 541 to 547 (i.e., 540). The plurality of word lines 530 and the plurality of cell contact plugs 540 may be connected to each other in pads provided by at least a portion of the plurality of word lines 530 extending in different lengths in the second horizontal direction HD2. A first metal layer 550b and a second metal layer 560b may be connected to an upper portion of the plurality of cell contact plugs 540 connected to the plurality of word lines 530, sequentially. The plurality of cell contact plugs 540 may be connected to the peripheral circuit region PERI by the upper bonding metals 571b and 572b of the cell region CELL and the lower bonding metals 671b and 672b of the peripheral circuit region PERI in the word line bonding area WLBA.

The plurality of cell contact plugs 540 may be electrically connected to the circuit elements 620b providing a row decoder 594 in the peripheral circuit region PERI. In an embodiment, operating voltages of the circuit elements 620b of the row decoder 594 may be different from operating voltages of the circuit elements 620c providing the page buffer 593. For example, operating voltages of the circuit elements 620c providing the page buffer 593 may be greater than operating voltages of the circuit elements 620b providing the row decoder 594.

A common source line contact plug 580 may be disposed in the external pad bonding area PA. The common source line contact plug 580 may be formed of a conductive material such as a metal, a metal compound, polysilicon, or the like, and may be electrically connected to the common source line 520. A first metal layer 550a and a second metal layer 560a may be stacked on an upper portion of the common source line contact plug 580, sequentially. For example, an area in which the common source line contact plug 580, the first metal layer 550a, and the second metal layer 560a are disposed may be defined as the external pad bonding area PA.

Input-output pads 605 and 505 may be disposed in the external pad bonding area PA. A lower insulating film 601 covering a lower surface of the first substrate 610 may be formed below the first substrate 610, and a first input-output pad 605 may be formed on the lower insulating film 601. The first input-output pad 605 may be connected to at least one of the plurality of circuit elements 620a, 620b, and 620c disposed in the peripheral circuit region PERI through a first input-output contact plug 603, and may be separated from the first substrate 610 by the lower insulating film 601. In addition, a side insulating film may be disposed between the first input-output contact plug 603 and the first substrate 610 to electrically separate the first input-output contact plug 603 and the first substrate 610.

An upper insulating film 501 covering the upper surface of the second substrate 510 may be formed on the second substrate 510, and a second input-output pad 505 may be disposed on the upper insulating layer 501. The second input-output pad 505 may be connected to at least one of the plurality of circuit elements 620a, 620b, and 620c disposed in the peripheral circuit region PERI through a second input-output contact plug 503.

According to embodiments, the second substrate 510 and the common source line 520 may not be disposed in an area in which the second input-output contact plug 503 is disposed. Also, the second input-output pad 505 may not overlap the word lines 530 in the vertical direction VD. The second input-output contact plug 503 may be separated from the second substrate 510 in a direction, parallel to the upper surface of the second substrate 510, and may pass through an interlayer insulating layer of the cell region CELL to be connected to the second input-output pad 505.

According to embodiments, the first input-output pad 605 and the second input-output pad 505 may be selectively formed. For example, the memory device 400 may include only the first input-output pad 605 disposed on the first substrate 610 or the second input-output pad 505 disposed on the second substrate 510. Alternatively, the memory device 400 may include both the first input-output pad 605 and the second input-output pad 505.

A metal pattern provided on an uppermost metal layer may be provided as a dummy pattern or the uppermost metal layer may be absent, in each of the external pad bonding area PA and the bit line bonding area BLBA, respectively included in the cell region CELL and the peripheral circuit region PERI.

In the external pad bonding area PA, the memory device 500 may include a lower metal pattern 673a, corresponding to an upper metal pattern 572a formed in an uppermost metal layer of the cell region CELL, and having the same cross-sectional shape as the upper metal pattern 572a of the cell region CELL so as to be connected to each other, in an uppermost metal layer of the peripheral circuit region PERI. In the peripheral circuit region PERI, the lower metal pattern 673a formed in the uppermost metal layer of the peripheral circuit region PERI may not be connected to a contact. Similarly, in the external pad bonding area PA, an upper metal pattern, corresponding to the lower metal pattern formed in an uppermost metal layer of the peripheral circuit region PERI, and having the same shape as a lower metal pattern of the peripheral circuit region PERI, may be formed in an uppermost metal layer of the cell region CELL.

The lower bonding metals 671b and 672b may be formed on the second metal layer 640b in the word line bonding area WLBA. In the word line bonding area WLBA, the lower bonding metals 671b and 672b of the peripheral circuit region PERI may be electrically connected to the upper bonding metals 571b and 572b of the cell region CELL by a Cu-to-Cu bonding.

Further, in the bit line bonding area BLBA, an upper metal pattern 592, corresponding to a lower metal pattern 652 formed in the uppermost metal layer of the peripheral circuit region PERI, and having the same cross-sectional shape as the lower metal pattern 652, may be formed in an uppermost metal layer of the cell region CELL. A contact may not be formed on the upper metal pattern 592 formed in the uppermost metal layer of the cell region CELL.

While the inventive concept has been particularly shown and described with reference to embodiments thereof, it will be understood that various changes in form and details may be made therein without departing from the spirit and scope of the following claims.

What is claimed is:

1. A memory device comprising:
   a memory cell array comprising a plurality of memory cells connected to bit lines; and
   a page buffer circuit connected to the bit lines,
   wherein the page buffer circuit comprises:
   page buffer units comprising a first set of page buffer units arranged in a first direction and a second set of page buffer units arranged in the first direction; and
   cache units arranged, in the first direction, between the first set of page buffer units and the second set of page buffer units, the cache units comprising first cache units respectively corresponding to the first set of page buffer units and second cache units respectively corresponding to the second set of page buffer units, wherein
   each of the page buffer units comprises a sensing node and a pass transistor connected to the sensing node and configured to be selectively turned on during a data transmission period,
   the first cache units share a first combined sensing node, and the first combined sensing node is connected to a pass transistor included in a first page buffer unit adjacent to the first cache units from among the first set of page buffer units, wherein the first set of page buffer units are connected to the first cache units through the first combined sensing node,
   the second cache units share a second combined sensing node, and the second combined sensing node is connected to a pass transistor included in a second page buffer unit adjacent to the second cache units from among the second set of page buffer units, wherein the second set of page buffer units are connected to the second cache units through the second combined sensing node and,
   the sensing nodes respectively corresponding to the page buffer units are configured to, during the data transmission period, be electrically connected to one another through serial connections of the pass transistors respectively included in the page buffer units.

2. The memory device of claim 1, configured such that, in a data sensing period, the pass transistors respectively corresponding to the page buffer units are turned off, and the sensing nodes respectively corresponding to the page buffer units are not electrically connected to one another.

3. The memory device of claim 1, configured such that, in the data transmission period, first data transmission operations between the first set of page buffer units and the first cache units are performed simultaneously with second data transmission operations between the second set of page buffer units and the second cache units.

4. The memory device of claim 3, configured such that, in the data transmission period:
   the first data transmission operations between the first set of page buffer units and the first cache units are sequentially performed, and
   the second data transmission operations between the second set of page buffer units and the second cache units are sequentially performed.

5. The memory device of claim 3, configured such that:
   in a first period of a pass/fail determination period after the data transmission period, first pass/fail determination operations regarding the first set of page buffer units are sequentially performed, and, in a second period of the pass/fail determination period, second pass/fail determination operations regarding the second set of page buffer units are sequentially performed.

6. The memory device of claim 1, wherein the first set of page buffer units comprise:
   a first page buffer unit comprising a first pass transistor between a first terminal and a first sensing node, a second pass transistor between the first sensing node and a second terminal, and a first main latch connected to the first sensing node; and
   a second page buffer unit comprising a third pass transistor between the second terminal and a second sensing node, a fourth pass transistor between the second sensing node and a third terminal, and a second main latch connected to the second sensing node.

7. The memory device of claim 6, wherein the first page buffer unit further comprises a first transistor connected between the first sensing node and the first main latch,
   the second page buffer unit further comprises a second transistor connected between the second sensing node and the second main latch,
   the first cache units comprise a first cache latch corresponding to the first page buffer unit and a second cache latch corresponding to the second page buffer unit, and,
   the memory device is configured such that in the data transmission period, the first transistor and the second transistor are sequentially turned on so that data stored in the first main latch and the second main latch are sequentially transmitted to the first cache latch and the second cache latch.

8. The memory device of claim 6, wherein the second page buffer units comprise:
   a third page buffer unit comprising a fifth pass transistor between a fourth terminal and a third sensing node, a sixth pass transistor between the third sensing node and a fifth terminal, and a third main latch connected to the third sensing node; and
   a fourth page buffer unit comprising a seventh pass transistor between the fifth terminal and a fourth sensing node, an eighth pass transistor between the fourth sensing node and a sixth terminal, and a fourth main latch connected to the fourth sensing node.

9. The memory device of claim 8, wherein the first cache units comprise:
   a first cache latch, which comprises a first dump transistor driven according to a first dump signal and corresponds to the first page buffer unit; and
   a second cache latch, which comprises a second dump transistor driven according to a second dump signal and corresponds to the second page buffer unit,
   the second cache units comprise:
   a third cache latch, which comprises a third dump transistor driven according to a third dump signal and corresponds to the third page buffer unit; and
   a fourth cache latch, which comprises a fourth dump transistor driven according to a fourth dump signal, and corresponds to the fourth page buffer unit, and
   the memory device is configured such that, in the data transmission period,
   the first dump transistor and the fourth dump transistor are simultaneously turned on so that data stored in the first main latch and the fourth main latch are simultaneously transmitted to the first cache latch and the fourth cache latch, respectively, and,
   subsequently, the second dump transistor and the third dump transistor are simultaneously turned on so that data stored in the second main latch and the third main latch are simultaneously transmitted to the second cache latch and the third cache latch.

10. The memory device of claim 9, wherein the page buffer circuit further comprises:
    a first pre-charge transistor configured to pre-charge the first combined sensing node between the second page buffer unit and the first cache latch; and
    a second pre-charge transistor configured to pre-charge the second combined sensing node between the fourth cache latch and the third page buffer unit, wherein
    the first pre-charge transistor and the second pre-charge transistor are configured to be turned on in a first pre-charge period before the first dump transistor and the fourth dump transistor are turned on, and thus the first pre-charge transistor and the second pre-charge transistor pre-charge the first combined sensing node and the second combined sensing node to a pre-charge level, and,
    the first pre-charge transistor and the second pre-charge transistor are configured to be turned on in a second pre-charge period before the second dump transistor and the third dump transistor are turned on, and thus the first pre-charge transistor and the second pre-charge transistor pre-charge the first combined sensing node and the second combined sensing node to a pre-charge level.

11. The memory device of claim 9, configured such that, when the first to eighth pass transistors are turned on:
    the first to fourth pass transistors are connected in series with one another and the first sensing node and the second sensing node are electrically connected to the first combined sensing node so that data is transmitted from the first cache latch to the first main latch or from the first main latch to the first cache latch, and
    the fifth to eighth pass transistors are connected in series with one another and the third sensing node and the fourth sensing node are electrically connected to the second combined sensing node so that data is transmitted from the fourth cache latch to the fourth main latch or from the fourth main latch to the fourth cache latch.

12. The memory device of claim 9, configured such that, when the third to sixth pass transistors are turned on:
    the third pass transistor and the fourth pass transistor are connected in series with each other and the second sensing node is electrically connected to the first combined sensing node so that data is transmitted from the second cache latch to the second main latch or from the second main latch to the second cache latch, and
    the fifth pass transistor and the sixth pass transistor are connected in series with each other and the third sensing node is electrically connected to the second combined sensing node so that data is transmitted from the third cache latch to the third main latch or from the third main latch to the third cache latch.

13. The memory device of claim 8, wherein each of first to fourth main latches comprises at least one of a sensing latch, a force latch, a most-significant-bit latch, and a least-significant-bit latch.

14. The memory device of claim 1, wherein the memory cell array is disposed in a first semiconductor layer, the page buffer circuit is disposed in a second semiconductor layer, the first semiconductor layer and the second semiconductor layer are arranged in a vertical direction, and the bit lines extend in the first direction.

15. A memory device comprising:
a memory cell array comprising a plurality of memory cells connected to bit lines; and
a page buffer circuit connected to the bit lines and arranged in first to fourth regions arranged in a first direction, wherein the page buffer circuit comprises:
upper page buffer units arranged in the first region in the first direction and each comprising an upper pass transistor and an upper sensing node line;
lower page buffer units arranged in the fourth region in the first direction and each comprising a lower pass transistor and a lower sensing node line;
upper cache units arranged in the second region in the first direction and commonly connected to a first combined sensing node; and
lower cache units arranged in the third region in the first direction and commonly connected to a second combined sensing node,
wherein the memory device is configured such that, in a data transmission period, upper sensing node lines respectively included in the upper page buffer units are connected to the first combined sensing node as upper pass transistors respectively included in the upper page buffer units are turned on and lower sensing node lines respectively included in the lower page buffer units are connected to the second combined sensing node as lower pass transistors respectively included in the lower page buffer units are turned on, and
wherein the upper sensing node lines and the lower sensing node lines are physically arranged to be aligned in the first direction.

16. The memory device of claim 15, configured such that, in the data transmission period, first data transmission operations between the upper page buffer units and the upper cache units are performed simultaneously with second data transmission operations between the lower page buffer units and the lower cache units.

17. The memory device of claim 16, configured such that, in the data transmission period:
the first data transmission operations between the upper page buffer units and the upper cache units are sequentially performed, and
the second data transmission operations between the lower page buffer units and the lower cache units are sequentially performed.

18. The memory device of claim 15, wherein the upper page buffer units comprise:
a first page buffer unit comprising a first upper pass transistor between a first terminal and a first sensing node and a second upper pass transistor between the first sensing node and a second terminal; and
a second page buffer unit comprising a third upper pass transistor between the second terminal and a second sensing node and a fourth upper pass transistor between the second sensing node and a third terminal, and the lower page buffer units comprise:
a third page buffer unit comprising a first lower pass transistor between a fourth terminal and a third sensing node and a second lower pass transistor between the third sensing node and a fifth terminal; and
a fourth page buffer unit comprising a third lower pass transistor between the fifth terminal and a fourth sensing node and a fourth lower pass transistor between the fourth sensing node and a sixth terminal.

19. The memory device of claim 15, further comprising a page buffer decoder between the second region and the third region,
wherein the memory device is configured such that:
in a first period of a pass/fail determination period after the data transmission period, the upper pass transistors are connected in series with each other and the upper sensing node lines are connected to the page buffer decoder through the first combined sensing node, and,
in a second period of a pass/fail determination period, the lower pass transistors are connected in series with each other and the lower sensing node lines are connected to the page buffer decoder through the second combined sensing node.

20. A memory device comprising:
a memory cell array comprising a plurality of memory cells connected to bit lines; and
a page buffer circuit comprising first page buffer units, second page buffer units, and cache units, which are arranged between the first page buffer units and the second page buffer units and comprise first cache units and second cache units,
wherein the memory device is configured such that:
in a data transmission period, first data transmission operations between the first page buffer units and the first cache units are performed simultaneously with second data transmission operations between the second page buffer units and the second cache units,
in a first period of a pass/fail determination period after the data transmission period, first pass/fail determination operations regarding the first page buffer units are sequentially performed, and,
in a second period of the pass/fail determination period, second pass/fail determination operations regarding the second page buffer units are sequentially performed,
and further comprising:
a page buffer decoder, wherein the memory device is configured such that:
in the first period, first sensing nodes of the first page buffer units are connected to one another and the first sensing nodes are connected to the page buffer decoder, and
in the second period, second sensing nodes of the second page buffer units are connected to one another and the second sensing nodes are connected to the page buffer decoder.

* * * * *